US009117717B2

(12) United States Patent
Kokubun

(10) Patent No.: US 9,117,717 B2
(45) Date of Patent: Aug. 25, 2015

(54) SOLID-STATE IMAGE PICKUP DEVICE HAVING A MULTILAYER INTERFERENCE FILTER INCLUDING AN UPPER LAMINATED STRUCTURE, A CONTROL STRUCTURE AND LOWER LAMINATED STRUCTURE

(75) Inventor: Koichi Kokubun, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 414 days.

(21) Appl. No.: 13/595,298

(22) Filed: Aug. 27, 2012

(65) Prior Publication Data

US 2013/0240708 A1 Sep. 19, 2013

(30) Foreign Application Priority Data

Mar. 14, 2012 (JP) ................................. 2012-056687

(51) Int. Cl.
| | | |
|---|---|---|
| H01J 5/16 | (2006.01) | |
| H01L 27/00 | (2006.01) | |
| H01L 31/00 | (2006.01) | |

(Continued)

(52) U.S. Cl.
CPC .... *H01L 27/14621* (2013.01); *H01L 27/14685* (2013.01); *H01L 31/02162* (2013.01)

(58) Field of Classification Search
CPC .................. H01L 27/14621; H01L 27/14645; H01L 27/14667; H01L 27/14647; H01L 27/14603; G01J 3/51; G01J 3/513; G01J 2003/516; G01J 3/36; G01T 3/4015
USPC .............. 250/226, 208.1, 239, 216; 257/257, 257/258, 290, 291, 431, 432, 440, 443; 348/272, 273, 274, 280, 281, 294
See application file for complete search history.

(56) References Cited

U.S. PATENT DOCUMENTS

| 7,416,915 B2 | 8/2008 | Kasano et al. |
| 7,701,024 B2 | 4/2010 | Kasano et al. |
| 7,750,354 B2 | 7/2010 | Kasano et al. |

(Continued)

FOREIGN PATENT DOCUMENTS

| JP | 2000-180621 | 6/2000 |
| JP | 2006-93292 | 4/2006 |

(Continued)

OTHER PUBLICATIONS

Office Action issued Jun. 10, 2014 in Japanese Patent Application No. 2012-056687 with English language translation.

*Primary Examiner* — Que T Le
*Assistant Examiner* — Jennifer Bennett
(74) *Attorney, Agent, or Firm* — Oblon, McClelland, Maier & Neustadt, L.L.P.

(57) ABSTRACT

A solid-state image pickup device including a pixel array having a plurality of pixels, each of which includes a photoelectric converting unit and a multilayer interference filter. The multilayer interference filter includes an upper laminated structure, a lower laminated structure, and a control structure. Both the multilayer interference filter in a first pixel and the multilayer interference filter in a second pixel which is more distant from a center of the pixel array than the first pixel are disposed to selectively guide a light having a first color to the photoelectric converting unit. The control structure in the first pixel and the control structure in the second pixel have different configurations from each other in such a manner that a filter characteristic of the multilayer interference filter in the first pixel is equivalent to that of the multilayer interference filter in the second pixel.

19 Claims, 12 Drawing Sheets

(51) Int. Cl.
*H01L 27/146* (2006.01)
*H01L 31/0216* (2014.01)

(56) References Cited

U.S. PATENT DOCUMENTS 7,759,679 B2 7/2010 Inaba et al.
2007/0058055 A1 3/2007 Yamaguchi et al.
2008/0259191 A1* 10/2008 Imamura et al. .............. 348/294

FOREIGN PATENT DOCUMENTS

| JP | 2006-197020 | * | 7/2006 |
| JP | 2006-202778 | | 8/2006 |
| JP | 2008-170979 | | 7/2008 |
| JP | 2009-72918 | | 4/2009 |
| WO | WO 2005/069376 A1 | | 7/2005 |

* cited by examiner

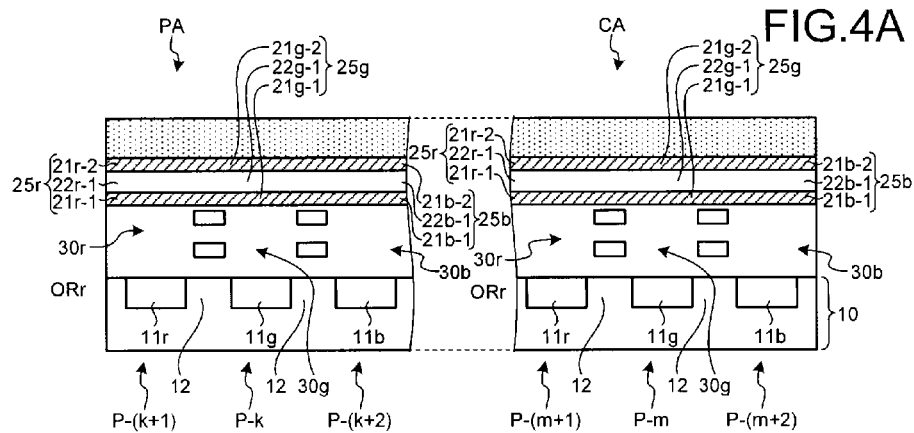
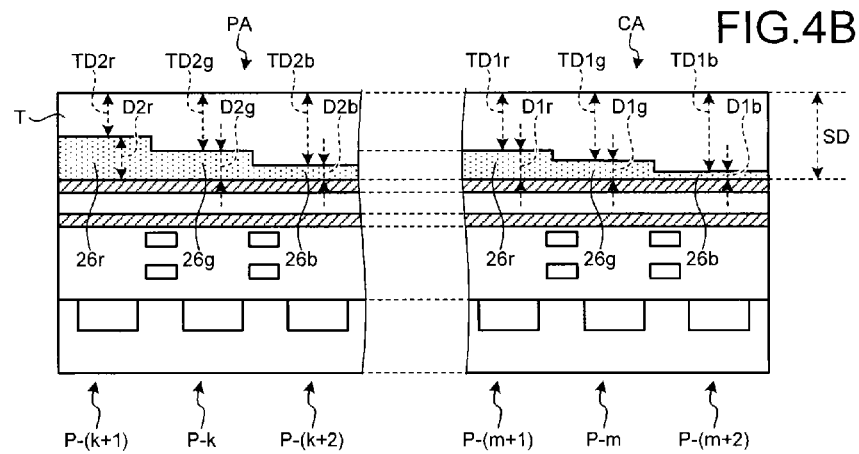
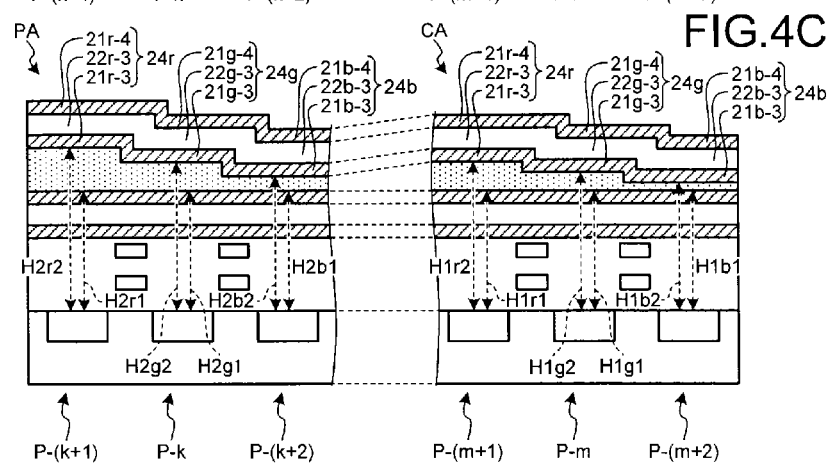

SOLID-STATE IMAGE PICKUP DEVICE HAVING A MULTILAYER INTERFERENCE FILTER INCLUDING AN UPPER LAMINATED STRUCTURE, A CONTROL STRUCTURE AND LOWER LAMINATED STRUCTURE

CROSS-REFERENCE TO RELATED APPLICATIONS

This application is based upon and claims the benefit of priority from Japanese Patent Application No. 2012-056687, filed on Mar. 14, 2012; the entire contents of which are incorporated herein by reference.

FIELD

Embodiments described herein relate generally to a solid-state image pickup device and a method of manufacturing the solid-state image pickup device.

BACKGROUND

A color filter to be used currently in an image sensor is constituted by an organic pigment. However, it is expected that the filter constituted by the organic pigment is compatible with a refinement of a pixel (an increase in the number of pixels) or a reduction in film thickness (contributing to a reduction in height) with difficulty on a processing basis with regard to a technical trend of the refinement or the reduction in height which is also represented by a back-side illumination type. Therefore, it is desired to develop a color filter having a novel structure to be replaced with the filter constituted by the organic pigment. Furthermore, it is desired to improve a filter characteristic in the color filter having the novel structure.

BRIEF DESCRIPTION OF THE DRAWINGS

FIGS. 4A to 4C are views each showing a method of manufacturing the solid-state image pickup device according to the first embodiment;

DETAILED DESCRIPTION

In general, according to one embodiment, there is provided a solid-state image pickup device including a pixel array having a plurality of pixels arranged two-dimensionally. Each of the plurality of pixels includes a photoelectric converting unit and a multilayer interference filter. The multilayer interference filter is disposed to selectively guide, to the photoelectric converting unit, any of incident lights which has a specific color. The multilayer interference filter in each of the plurality of pixels includes an upper laminated structure, a lower laminated structure, and a control structure. The upper laminated structure in which first and second layers having different refractive indices from each other are laminated alternately. The lower laminated structure in which the first layer and the second layer are laminated alternatively. The control structure is formed between the upper laminated structure and the lower laminated structure in order to control a filter characteristic of the multilayer interference filter. Both the multilayer interference filter in a first pixel of the plurality of pixels and the multilayer interference filter in a second pixel of the plurality of pixels which is more distant from a center of the pixel array than the first pixel are disposed to selectively guide a light having a first color to the photoelectric converting unit. The control structure in the first pixel and the control structure in the second pixel have different configurations from each other in such a manner that a filter characteristic of the multilayer interference filter in the first pixel is equivalent to that of the multilayer interference filter in the second pixel.

Exemplary embodiments of a solid-state image pickup device will be explained below in detail with reference to the accompanying drawings. The present invention is not limited to the following embodiments.

First Embodiment

Figure 1:
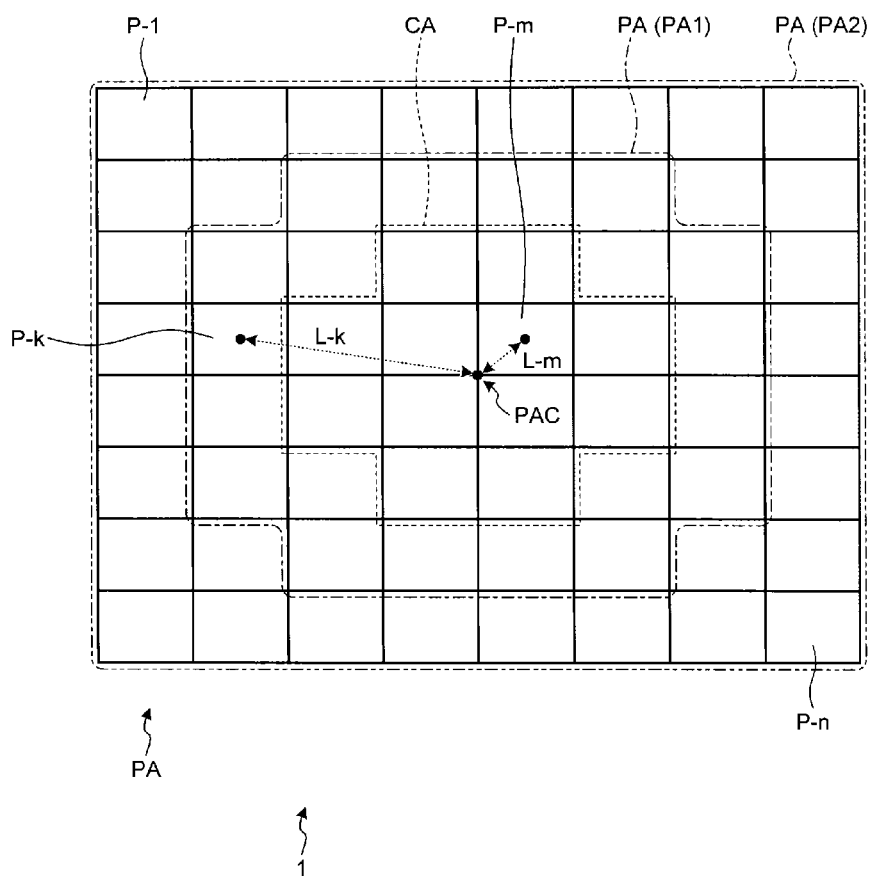
FIG. 1 is a view showing a structure of a solid-state image pickup device according to a first embodiment.

A solid-state image pickup device 1 according to an embodiment will be described with reference to FIG. 1. FIG. 1 is a view illustrating a structure of the solid-state image pickup device 1 according to the embodiment.

The solid-state image pickup device 1 forms an image of an object on a pixel array PA by means of a lens of a camera (which is not shown), for example. In the pixel array PA, a plurality of pixels P-1 to P-n are arranged two-dimensionally. Each of the pixels P-1 to P-n carries out a photoelectric conversion for an incident light and generates a pixel signal corresponding to a quantity of the incident light. The pixel signal of each of the pixels P-1 to P-n is read by a peripheral circuit (not shown) of the pixel array PA. Consequently, the solid-state image pickup device 1 picks up the image of the subject on the pixel array PA and outputs an image signal including a plurality of pixel signals.

At this time, it is necessary to selectively carry out a photoelectric conversion for lights in wavelength ranges having three primary colors (a red color (R), a green color (G) and a blue color (B)) in the incident lights in order to pick up the object image in colors. Therefore, each of the pixels P-1 to P-n is provided with a color filter in accordance with the Bayer array (see FIG. 8A), for example.

In general, the color filter is often constituted by an organic pigment. However, it is expected that the color filter constituted by the organic pigment is not compatible with a refinement of a pixel (that is, an increase in the number of pixels) or a reduction in film thickness (contributing to a reduction in height), because the color filter constituted by the organic pigment is difficult to process finely with regard to a technical trend of the refinement or the reduction in height which is also represented by a back-side illumination type that will be increasingly advanced in the future.

Figure 2:
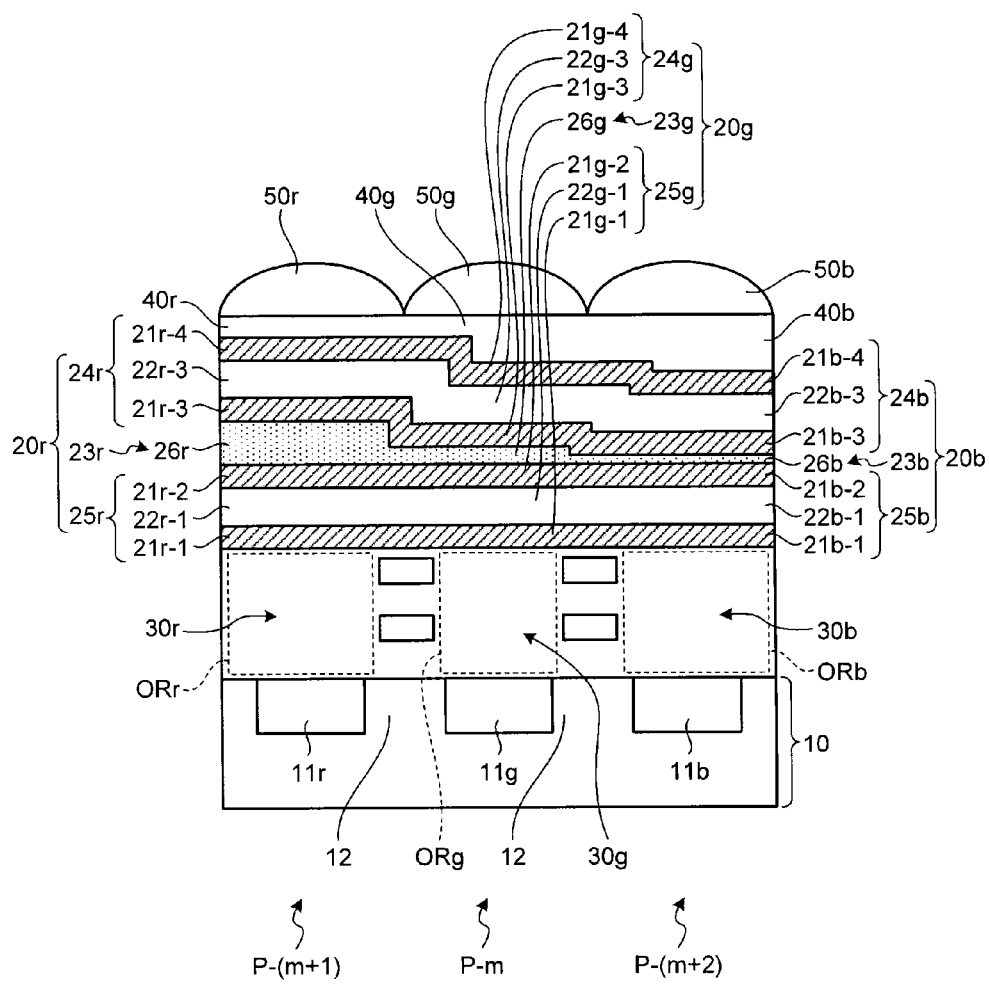
FIG. 2 is a view showing the structure of the solid-state image pickup device according to the first embodiment.

In the present embodiment, therefore, a multilayer interference filter using an inorganic material is employed as the color filter as shown in FIG. 2. FIG. 2 is a view illustrating a sectional structure for three pixels corresponding to the red color (R), the green color (G) and the blue color (B) in the solid-state image pickup device 1.

More specifically, the solid-state image pickup device 1 includes photoelectric converting units 11r, 11g and 11b, multilayer wiring structures 30r, 30g and 30b, multilayer interference filters 20r, 20g and 20b, flattened layers 40r, 40g and 40b, and microlenses 50r, 50g and 50b.

The photoelectric converting units 11r, 11g and 11b are disposed in a well area 12 in a semiconductor substrate 10. The photoelectric converting units 11r, 11g and 11b receive the lights in the wavelength ranges having the red color (R), the green color (G) and the blue color (B), respectively. The photoelectric converting units 11r, 11g and 11b generate and store electric charges corresponding to the received lights, respectively. The photoelectric converting units 11r, 11g and 11b are photodiodes and include electric charge storage areas, for example.

The well area 12 is formed of a semiconductor (for example, silicon) containing an impurity of a first conductivity type (for example, a P type) in a low concentration. A P-type impurity is boron, for example. The electric charge storage areas in the photoelectric converting units 11r, 11g and 11b are formed of a semiconductor (for example, silicon) containing an impurity of a second conductivity type (for example, an N type) to be opposite to the first conductivity type in a higher concentration than the concentration of the impurity of the first conductivity type in the well area 12, respectively. The N-type impurity is phosphorus or arsenic, for example.

The multilayer wiring structures 30r, 30g and 30b are disposed on the semiconductor substrate 10. In the multilayer wiring structures 30r, 30g and 30b, wiring patterns for a plurality of layers are extended in an interlayer dielectric. Consequently, the multilayer wiring structures 30r, 30g and 30b define opening areas ORr, ORg and ORb corresponding to the photoelectric converting units 11r, 11g and 11b, respectively. The interlayer dielectric is formed of a silicon oxide, for example. The wiring pattern is formed of a metal, for example.

The multilayer interference filter 20r is provided above the photoelectric converting unit 11r. Consequently, the multilayer interference filter 20r selectively guides, to the photoelectric converting unit 11r, a light in the wavelength range of the red color (R) of the incident lights. In other words, the multilayer interference filter 20r functions as a color filter for the red color (R). The multilayer interference filter 20r is formed of an inorganic substance. The multilayer interference filter 20r is a filter for the red color of a photonic crystal type in which an inorganic material (a material having a low refractive index or a material having a high refractive index) is laminated, for example.

More specifically, the multilayer interference filter 20r has an upper laminated structure 24r, a control structure 23r and a lower laminated structure 25r. The upper laminated structure 24r and the lower laminated structure 25r function as mirrors having reflecting surfaces opposed to each other, respectively. In this case, the upper laminated structure 24r and the lower laminated structure 25r have a wavelength in a central part (for example, 550 nm) of a visible area (a wavelength range of 400 nm to 700 nm, for example) as a central wavelength (that is, a wavelength in which the mirror has a peak reflectance). The control structure 23r is formed on an interface between the upper laminated structure 24r and the lower laminated structure 25r, and controls a filter characteristic of the multilayer interference filter 20r. In other words, the control structure 23r carries out an interference of a light (a multiple beam interference) subjected to a multiple reflection over the reflecting surfaces of the upper laminated structure 24r and the lower laminated structure 25r. More specifically, the multilayer interference filter 20r functions based on the same principle as the Fabry-Perot interferometer.

In the upper laminated structure 24r, first layers 21r-3 and 21r-4 and a second layer 22r-3 which have different refractive indices from each other are laminated alternately. In the upper laminated structure 24r, the first layer 21r-3, the second layer 22r-3 and the first layer 21r-4 are laminated in sequence, for example.

In the lower laminated structure 25r, first layers 21r-1 and 21r-2 and a second layer 22r-1 which have different refractive indices from each other are laminated alternately. In the lower laminated structure 25r, the first layer 21r-1, the second layer 22r-1 and the first layer 21r-2 are laminated in sequence, for example.

The refractive indices of the first layers 21r-1, 21r-2, 21r-3 and 21r-4 are higher than those of the second layers 22r-1 and 22r-3, for example. The first layers 21r-1, 21r-2, 21r-3 and 21r-4 are formed of a titanium oxide ($TiO_2$, a refractive index of 2.5), for example. The second layers 22r-1 and 22r-3 are formed of a silicon oxide ($SiO_2$, a refractive index of 1.46), for example.

The control structure 23r has a control layer 26r between the upper laminated structure 24r and the lower laminated structure 25r. A refractive index of the control layer 26r is lower than the refractive indices of the first layers 21r-1, 21r-2, 21r-3 and 21r-4. The control layer 26r is formed of a silicon oxide ($SiO_2$, a refractive index of 1.46), for example.

The multilayer interference filter 20g is provided above the photoelectric converting unit 11g. Consequently, the multilayer interference filter 20g selectively guides, to the photoelectric converting unit 11g, a light in the wavelength range of the green color (G) of the incident lights. In other words, the multilayer interference filter 20g functions as a color filter for the green color (G). The multilayer interference filter 20g is formed of an inorganic substance. The multilayer interference filter 20g is a filter for the green color of the photonic crystal type in which an inorganic material (a material having a low refractive index or a material having a high refractive index) is laminated, for example.

More specifically, the multilayer interference filter 20g has an upper laminated structure 24g, a control structure 23g and a lower laminated structure 25g. The upper laminated structure 24g and the lower laminated structure 25g function as mirrors having reflecting surfaces opposed to each other, respectively. In this case, the upper laminated structure 24g and the lower laminated structure 25g have a wavelength in a central part (for example, 550 nm) of a visible area (for example, a wavelength range of 400 nm to 700 nm) as a central wavelength (that is, a wavelength in which the mirror has a peak reflectance). The control structure 23g is formed on an interface between the upper laminated structure 24g and the lower laminated structure 25g, and controls a filter characteristic of the multilayer interference filter 20g. In other words, the control structure 23g carries out an interference of a light (a multiple beam interference) subjected to a multiple reflection over the reflecting surfaces of the upper laminated structure 24g and the lower laminated structure 25g. More specifically, the multilayer interference filter 20g functions based on the same principle as the Fabry-Perot interferometer.

In the upper laminated structure 24g, first layers 21g-3 and 21g-4 and a second layer 22g-3 which have different refractive indices from each other are laminated alternately. In the upper laminated structure 24g, the first layer 21g-3, the second layer 22g-3 and the first layer 21g-4 are laminated in sequence, for example.

In the lower laminated structure 25g, first layers 21g-1 and 21g-2 and a second layer 22g-1 which have different refractive indices from each other are laminated alternately. In the lower laminated structure 25g, the first layer 21g-1, the second layer 22g-1 and the first layer 21g-2 are laminated in sequence, for example.

The refractive indices of the first layers 21g-1, 21g-2, 21g-3 and 21g-4 are higher than those of the second layers 22g-1 and 22g-3, for example. The first layers 21g-1, 21g-2, 21g-3 and 21g-4 are formed of a titanium oxide ($TiO_2$, a refractive index of 2.5), for example. The second layers 22g-1 and 22g-3 are formed of a silicon oxide ($SiO_2$, a refractive index of 1.46), for example.

The control structure 23g has a control layer 26g between the upper laminated structure 24g and the lower laminated structure 25g. A refractive index of the control layer 26g is lower than the refractive indices of the first layers 21g-1, 21g-2, 21g-3 and 21g-4. The control layer 26g is formed of a silicon oxide ($SiO_2$, a refractive index of 1.46), for example.

The multilayer interference filter 20b is provided above the photoelectric converting unit 11b. Consequently, the multilayer interference filter 20b selectively guides, to the photoelectric converting unit 11b, a light in the wavelength range of the blue color (B) of the incident lights. In other words, the multilayer interference filter 20b functions as a color filter for the blue color (B). The multilayer interference filter 20b is formed of an inorganic substance. The multilayer interference filter 20b is a filter for the blue color of the photonic crystal type in which an inorganic material (a material having a low refractive index or a material having a high refractive index) is laminated, for example.

More specifically, the multilayer interference filter 20b has an upper laminated structure 24b, a control structure 23b and a lower laminated structure 25b. The upper laminated structure 24b and the lower laminated structure 25b function as mirrors having reflecting surfaces opposed to each other, respectively. In this case, the upper laminated structure 24b and the lower laminated structure 25b have a wavelength in a central part (for example, 550 nm) of a visible area (for example, a wavelength range of 400 nm to 700 nm) as a central wavelength (that is, a wavelength in which the mirror has a peak reflectance). The control structure 23b is formed on an interface between the upper laminated structure 24b and the lower laminated structure 25b, and controls a filter characteristic of the multilayer interference filter 20b. In other words, the control structure 23b carries out an interference of a light (a multiple beam interference) subjected to a multiple reflection over the reflecting surfaces of the upper laminated structure 24b and the lower laminated structure 25b. More specifically, the multilayer interference filter 20b functions based on the same principle as the Fabry-Perot interferometer.

In the upper laminated structure 24b, first layers 21b-3 and 21b-4 and a second layer 22b-3 which have different refractive indices from each other are laminated alternately. In the upper laminated structure 24b, the first layer 21b-3, the second layer 22b-3 and the first layer 21b-4 are laminated in sequence, for example.

In the lower laminated structure 25b, first layers 21b-1 and 21b-2 and a second layer 22b-1 which have different refractive indices from each other are laminated alternately. In the lower laminated structure 25b, the first layer 21b-1, the second layer 22b-1 and the first layer 21b-2 are laminated in sequence, for example.

The refractive indices of the first layers 21b-1, 21b-2, 21b-3 and 21b-4 are higher than those of the second layers 22b-1 and 22b-3, for example. The first layers 21b-1, 21b-2, 21b-3 and 21b-4 are formed of a titanium oxide ($TiO_2$, a refractive index of 2.5), for example. The second layers 22b-1 and 22b-3 are formed of a silicon oxide ($SiO_2$, a refractive index of 1.46), for example.

The control structure 23b has a control layer 26b between the upper laminated structure 24b and the lower laminated structure 25b. A refractive index of the control layer 26b is lower than the refractive indices of the first layers 21b-1, 21b-2, 21b-3 and 21b-4. The control layer 26b is formed of a silicon oxide ($SiO_2$, a refractive index of 1.46), for example.

The flattened layers 40r, 40g and 40b cover the multilayer interference filters 20r, 20g and 20b, respectively. Consequently, the flattened layers 40r, 40g and 40b relieve a step among the multilayer interference filters 20r, 20g and 20b and provide flat surfaces. The flattened layers 40r, 40g and 40b are formed of a predetermined resin or oxide film (such as $SiO_2$), for example.

The microlenses 50r, 50g and 50b are provided on the flattened layers 40r, 40g and 40b, respectively. Consequently, the microlenses 50r, 50g and 50b collect an incident light onto the photoelectric converting units 11r, 11g and 11b via the multilayer interference filters 20r, 20g and 20b, respectively. The microlenses 50r, 50g and 50b are formed of a predetermined resin, for example.

In the multilayer interference filters 20r, 20g and 20b shown in FIG. 2, the control structure formed on the interface between the upper laminated structure and the lower laminated structure controls a filter characteristic thereof. More specifically, in the multilayer interference filters 20r, 20g and 20b, transmission bandwidths thereof are varied depending on a difference in a film thickness of the control layer over the interface between the upper laminated structure and the lower laminated structure, respectively. For example, in the multilayer interference filters 20r, 20g and 20b, if the film thicknesses of the control layers 26r, 26g and 26b are set to be 110 nm, 50 nm and 10 nm respectively, the wavelength bands for the red color (R), the green color (G) and the blue color (B) have a peak of a spectral transmittance as shown in FIG. 12B.

The present inventor made investigations and found that the filter characteristic of the multilayer interference filter might be varied between the pixels P-1 to P-n in the pixel array PA. For example, in the case in which an optical axis of a lens of a camera (not shown) is adjusted to pass through the vicinity of a center PAC of the pixel array PA, an incidence angle of a light on the pixel is varied depending on a distance from the center PAC of the pixel array PA to the pixel.

Figure 12A:
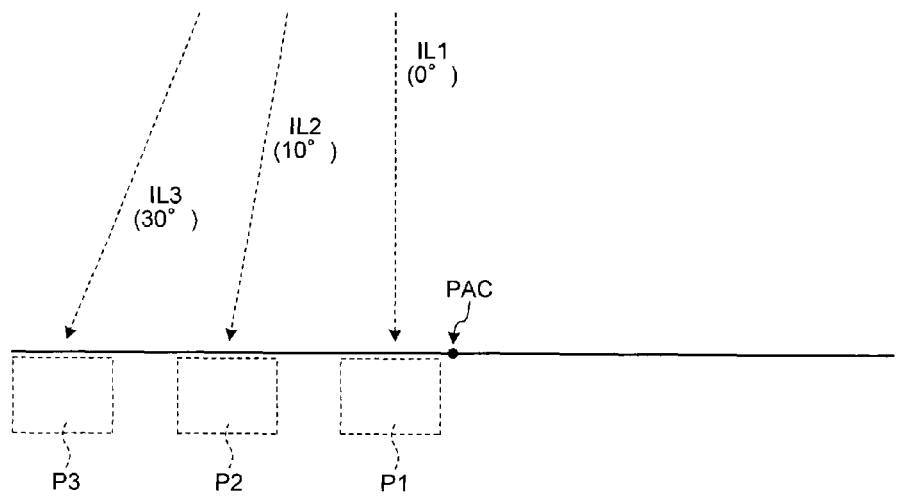
FIGS. 12A and 12B are views each showing a comparative example.
Figure 12B:
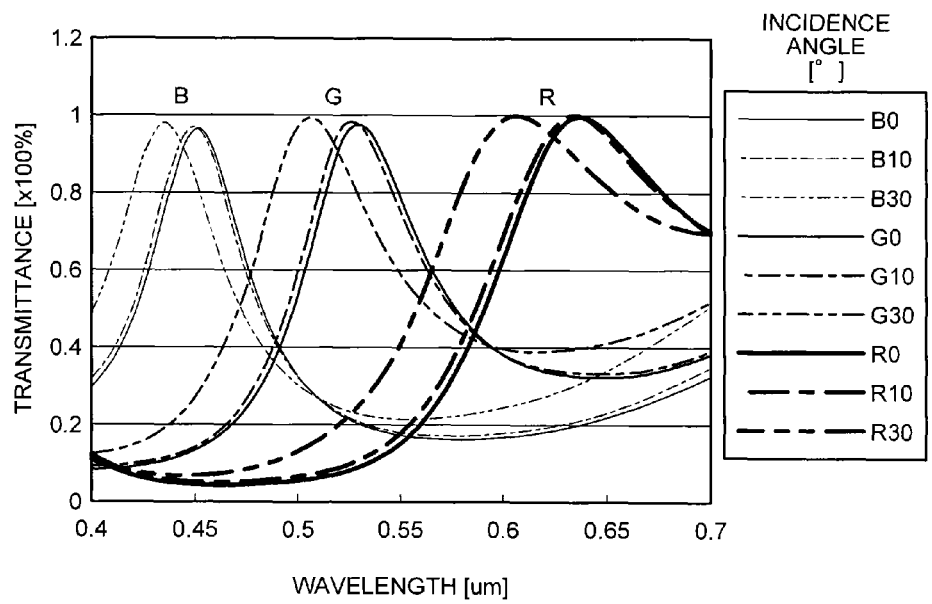

For example, as shown in FIG. 12A, an incidence angle of an incident light IL1 on a close pixel P1 to the center PAC of the pixel array PA is approximately 0°. At this time, for example, an incidence angle of an incident light IL2 on a pixel P2 which is more distant from the center PAC of the pixel array PA than the pixel P1 is approximately 10°. For example, an incidence angle of an incident light IL3 on a pixel P3 which is more distant from the center PAC of the pixel array PA than the pixel P2 is approximately 30°.

The present inventor carried out a simulation for the case in which all of the pixels P1 to P3 have the multilayer interference filter 20r including control layers designed for the red color (R) and having equivalent film thicknesses to each other, for example. As a result, as shown in FIG. 12B, it was found that the peak of the spectral transmittance of the multilayer interference filter 20r is shifted toward a short wavelength side when the incidence angle of the incident light is gradually increased from 0° (a solid line)→10° (a broken line)→30° (a one-dotted chain line). For example, as compared with the case in which the incidence angle of the incident light is 0° (the solid line), the peak is shifted to the short wavelength side by 3 nm in the case in which the incidence angle of the incident light is 10° (the broken line). For example, as compared with the case in which the incidence angle of the incident light is 0° (the solid line), the peak is shifted to the short wavelength side by 30 nm in the case in which the incidence angle of the incident light is 30° (the one-dotted chain line).

Moreover, the present inventor carried out a simulation for the case in which all of the pixels P1 to P3 have the multilayer interference filter 20g including control layers designed for the green color (G) and having equivalent film thicknesses to each other, for example. As a result, as shown in FIG. 12B, it was found that the peak of the spectral transmittance of the multilayer interference filter 20g is shifted to the short wavelength side when the incidence angle of the incident light is gradually increased from 0° (the solid line)→10° (the broken line)→30° (the one-dotted chain line). For example, as compared with the case in which the incidence angle of the incident light is 0° (the solid line), the peak is shifted to the short wavelength side by 3 nm in the case in which the incidence angle of the incident light is 10° (the broken line). For example, as compared with the case in which the incidence angle of the incident light is 0° (the solid line), the peak is shifted to the short wavelength side by 30 nm in the case in which the incidence angle of the incident light is 30° (the one-dotted chain line).

Furthermore, the present inventor carried out a simulation for the case in which all of the pixels P1 to P3 have the multilayer interference filter 20b including control layers designed for the blue color (B) and having equivalent film thicknesses to each other, for example. As a result, as shown in FIG. 12B, it was found that the peak of the spectral transmittance of the multilayer interference filter 20b is shifted to the short wavelength side when the incidence angle of the incident light is gradually increased from 0° (the solid line) →10° (the broken line)→30° (the one-dotted chain line). For example, as compared with the case in which the incidence angle of the incident light is 0° (the solid line), the peak is shifted to the short wavelength side by 3 nm in the case in which the incidence angle of the incident light is 10° (the broken line). For example, as compared with the case in which the incidence angle of the incident light is 0° (the solid line), the peak is shifted to the short wavelength side by 30 nm in the case in which the incidence angle of the incident light is 30° (the one-dotted chain line).

In other words, the multilayer interference filter controls the filter characteristic in the film thickness of the control layer. Therefore, it can be supposed that an optical film thickness of the control layer is varied and the filter characteristic of the multilayer interference filter is also shifted from a designed filter characteristic when the incidence angle of the incident light is gradually increased from 0°. Thus, there is a possibility that a peak shift might be caused by an oblique incidence angle of a light (particularly, a principal ray angle) and the filter characteristic of the multilayer interference filter might have a variation between the pixels P-1 to P-n in the pixel array PA. Consequently, there is a possibility that the picture quality of an image obtained by an image signal picked up through the solid-state image pickup device 1 might be deteriorated, for example.

In the present embodiment, therefore, a configuration is made different between a control structure of any of the pixels P-1 to P-n in the pixel array PA which is close to the center PAC of the pixel array PA and that of any of them which is distant from the center PAC of the pixel array PA. Consequently, the filter characteristic of the multilayer interference filter of the close pixel to the center PAC of the pixel array PA and the filter characteristic in the distant pixel from the center PAC of the pixel array PA are made equivalent to each other.

More specifically, as shown in FIG. 1, an inner part of the pixel array PA is divided into an area in the vicinity of the center PAC of the pixel array PA and a peripheral area thereof. For example, the inner part of the pixel array PA is divided into a central area CA including the center PAC of the pixel array PA illustrated as an area on an inside of the broken line in FIG. 1 and the peripheral area PA illustrated, in FIG. 1, as an area on an outside in the broken line.

Figure 3:
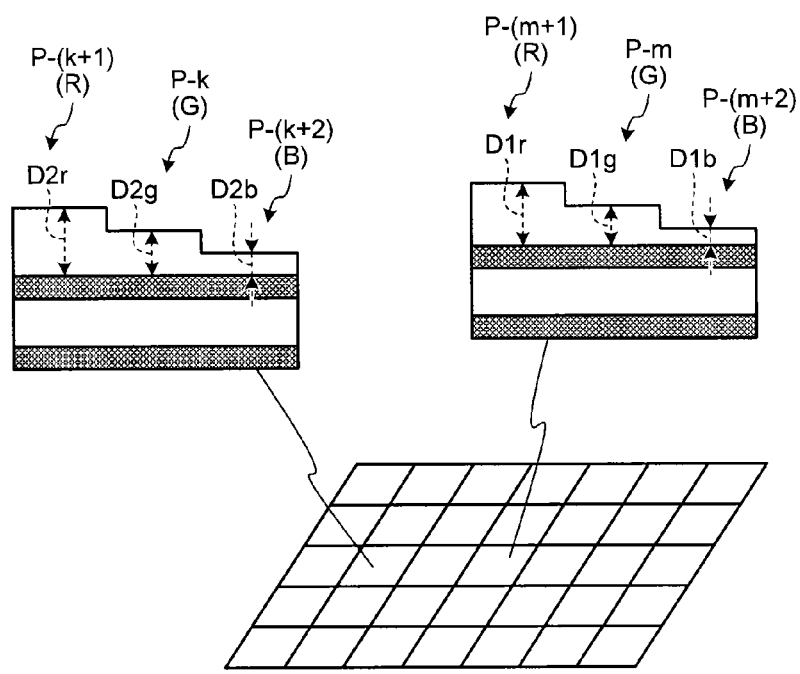
FIG. 3 is a view showing the structure of the solid-state image pickup device according to the first embodiment.

As shown in FIG. 3, a thickness of the control layer in the pixel of the peripheral area PA is set to be greater than that of the control layer in the pixel of the central area CA between the pixels corresponding to the same color. Although only the lower laminated structure and the control layer in the multilayer interference filter are shown for convenience of the description and simplicity of the illustration in FIG. 3, the upper laminated structure is actually formed on the control layer (see FIG. 2).

For example, both of the multilayer interference filters 20g in the pixels P-m and P-k shown in FIG. 3 are provided to selectively guide the light having the green color (G) to the photoelectric converting unit 11g (see FIG. 2). The pixel P-m is included in the central area CA and the pixel P-k is included in the peripheral area PA (see FIG. 1). In other words, the pixel P-k is disposed in a position which is more distant from the center PAC of the pixel array PA than the pixel P-m. The control structure 23g in the pixel P-m of the central area CA includes the control layer 26g having a film thickness D1g between the upper laminated structure 24g and the lower laminated structure 25g. The control structure 23g in the pixel P-k of the peripheral area PA includes the control layer 26g having a film thickness D2g (>D1g) between the upper laminated structure 24g and the lower laminated structure 25g. In other words, the control layer 26g in the pixel P-k of the peripheral area PA is thicker than the control layer 26g in the pixel P-m of the central area CA. Consequently, the peak of the spectral transmittance of the multilayer interference filter 20g in the pixel P-k of the peripheral area PA can be shifted to a long wavelength side so as to approximate to that of the spectral transmittance of the multilayer interference filter 20g in the pixel P-m of the central area CA. More specifically, the filter characteristic of the multilayer interference filter 20g in the pixel P-k of the peripheral area PA and that of the multilayer interference filter 20g in the pixel P-m of the central area CA can be made equivalent to each other.

For example, in the case in which the surface of the semiconductor substrate 10 is set to be a reference as shown in FIG. 4C, a height H2g1 of a main surface at the semiconductor substrate 10 side of the control layer 26g in the pixel P-k of the peripheral area PA is equivalent to a height H1g1 of a main surface at the semiconductor substrate 10 side of the control layer 26g in the pixel P-m of the central area CA. A height H2g2 of a main surface at an opposite side to the semiconductor substrate 10 of the control layer 26g in the pixel P-k of the peripheral area PA is higher than a height H1g2 of a main surface at the opposite side to the semiconductor substrate 10 of the control layer 26g in the pixel P-m of the central area CA. This structure can be manufactured by using a three-dimensional imprint technique as will be described below.

For example, both of the multilayer interference filters 20r in pixels P-(m+1) and P-(k+1) shown in FIG. 3 are provided to selectively guide the light having the red color (R) to the photoelectric converting unit 11r (see FIG. 2). The pixel P-(m+1) is included in the central area CA and the pixel P-(k+1) is included in the peripheral area PA (see FIG. 1). In other words, the pixel P-(k+1) is disposed in a position which is more distant from the center PAC of the pixel array PA than the pixel P-(m+1). The control structure 23r in the pixel P-(m+1) of the central area CA has the control layer 26r having a film thickness D1r between the upper laminated structure 24r and the lower laminated structure 25r. The control structure 23r in the pixel P-(k+1) of the peripheral area PA has the control layer 26r having a film thickness D2r (>D1r) between the upper laminated structure 24r and the lower laminated structure 25r. In other words, the control layer 26r in the pixel P-(k+1) of the peripheral area PA is thicker than the control layer 26r in the pixel P-(m+1) of the central area CA. Consequently, the peak of the spectral transmittance of the multilayer interference filter 20r in the pixel P-(k+1) of the peripheral area PA can be shifted to a long wavelength side so as to approximate to that of the spectral transmittance of the multilayer interference filter 20r in the pixel P-(m+1) of the central area CA. More specifically, the filter characteristic of the multilayer interference filter 20r in the pixel P-(k+1) of the peripheral area PA and that of the multilayer interference filter 20r in the pixel P-(m+1) of the central area CA can be made equivalent to each other.

Both of the multilayer interference filters 20r in the pixels P-(m+1) and P-(k+1) shown in FIG. 3 are provided to selectively guide, to a photoelectric converting unit 11r, a light having a longer wavelength than the multilayer interference filters 20g in the pixels P-m and P-k. Correspondingly, a film thickness D1r of the control layer 26r in the pixel P-(m+1) is greater than a film thickness D1g of the control layer 26g in the pixel P-m. Moreover, a film thickness D2r of the control layer 26r in the pixel P-(k+1) is greater than a film thickness D2g of the control layer 26g in the pixel (P-k).

For example, in the case in which the surface of the semiconductor substrate 10 is set to be a reference as shown in FIG. 4C, a height H2r1 of a main surface at the semiconductor substrate 10 side of the control layer 26r in the pixel P-(k+1) of the peripheral area PA is equivalent to a height H1r1 of a main surface at the semiconductor substrate 10 side of the control layer 26r in the pixel P-(m+1) of the central area CA. A height H2r2 of a main surface at an opposite side to the semiconductor substrate 10 of the control layer 26r in the pixel P-(k+1) of the peripheral area PA is higher than a height H1r2 of a main surface at the opposite side to the semiconductor substrate 10 of the control layer 26r in the pixel P-(m+1) of the central area CA. This structure can be manufactured by using a three-dimensional imprint technique as will be described below.

For example, both of the multilayer interference filters 20b in the pixels P-(m+2) and P-(k+2) shown in FIG. 3 are provided to selectively guide the light having the blue color (B) to the photoelectric converting unit 11b (see FIG. 2). The pixel P-(m+2) is included in the central area CA and the pixel P-(k+2) is included in the peripheral area PA (see FIG. 1). In other words, the pixel P-(k+2) is disposed in a position which is more distant from the center PAC of the pixel array PA than the pixel P-(m+2). The control structure 23b in the pixel P-(m+2) of the central area CA has the control layer 26b having a film thickness D1b between the upper laminated structure 24b and the lower laminated structure 25b. The control structure 23b in the pixel P-(k+2) of the peripheral area PA has the control layer 26b having a film thickness D2b (>D1b) between the upper laminated structure 24b and the lower laminated structure 25b. In other words, the control layer 26b in the pixel P-(k+2) of the peripheral area PA is thicker than the control layer 26b in the pixel P-(m+2) of the central area CA. Consequently, the peak of the spectral transmittance of the multilayer interference filter 20b in the pixel P-(k+2) of the peripheral area PA can be shifted to a long wavelength side so as to approximate to that of the spectral transmittance of the multilayer interference filter 20b in the pixel P-(m+2) of the central area CA. More specifically, the filter characteristic of the multilayer interference filter 20b in the pixel P-(k+2) of the peripheral area PA and that of the multilayer interference filter 20b in the pixel P-(m+2) of the central area CA can be made equivalent to each other.

Both of the multilayer interference filters 20b in the pixels P-(m+2) and P-(k+2) shown in FIG. 3 are provided to selectively guide, to a photoelectric converting unit 11b, a light having a shorter wavelength than the multilayer interference filters 20g in the pixels P-m and P-k. Correspondingly, a film thickness D1b of the control layer 26b in the pixel P-(m+2) is smaller than a film thickness D1g of the control layer 26g in the pixel P-m. Moreover, a film thickness D2b of the control layer 26b in the pixel P-(k+2) is smaller than a film thickness D2g of the control layer 26g in the pixel P-k.

For example, in the case in which the surface of the semiconductor substrate 10 is set to be a reference as shown in FIG. 4C, a height H2b1 of a main surface at the semiconductor substrate 10 side of the control layer 26b in the pixel P-(k+2) of the peripheral area PA is equivalent to a height H1b1 of a main surface at the semiconductor substrate 10 side of the control layer 26b in the pixel P-(m+2) of the central area CA. A height H2b2 of a main surface at an opposite side to the semiconductor substrate 10 of the control layer 26b in the pixel P-(k+2) of the peripheral area PA is higher than a height H1b2 of a main surface at the opposite side to the semiconductor substrate 10 of the control layer 26b in the pixel P-(m+2) of the central area CA. This structure can be manufactured by using the three-dimensional imprint technique as will be described below.

Next, a method of manufacturing the solid-state image pickup device 1 will be described with reference to FIGS. 4A to 4C. FIGS. 4A to 4C are sectional views showing steps in the method of manufacturing the solid-state image pickup device 1, respectively.

In the case in which the control layers having the different film thicknesses in the pixel array PA described above are formed, it is necessary to devise the manufacturing method. In the present embodiment, therefore, a control layer of each pixel is formed by using a template T which is suitable for the structure through the three-dimensional imprint technique.

More specifically, at the step shown in FIG. 4A, the photoelectric converting units 11r, 11g and 11b including the electric charge storage areas respectively are formed in the well area 12 of the semiconductor substrate 10 for the pixels P-(m+1), P-m and P-(m+2) of the central area CA and the pixels P-(k+1), P-k and P-(k+2) of the peripheral area PA by an ion implantation process or the like. The well area 12 is formed of a semiconductor (for example, silicon) containing an impurity of a first conductivity type (for example, a P type) in a low concentration. The electric charge storage areas in the photoelectric converting units 11r, 11g and 11b are formed by implanting, into the well area 12 of the semiconductor substrate 10, an impurity of a second conductivity type (for example, an N type) to be opposite to the first conductivity type in a higher concentration than that of the impurity of the first conductivity type in the well area 12, for instance.

An interlayer dielectric covering the semiconductor substrate 10 is formed by depositing SiO$_2$ through a CVD process or the like, for example. Then, there is repetitively carried out a processing for forming a wiring pattern on the interlayer dielectric through a sputtering process, a lithographic process and the like and forming an interlayer dielectric covering the interlayer dielectric and the wiring pattern by SiO$_2$ through the CVD process, for example. Consequently, the multilayer wiring structures 30r, 30g and 30b are formed.

Next, the lower laminated structures 25r, 25g and 25b to be lower parts of the multilayer interference filters 20r, 20g and 20b are formed for the pixels P-(m+1), P-m and P-(m+2) of the central area CA and the pixels P-(k+1), P-k and P-(k+2) of the peripheral area PA, respectively. More specifically, they are formed by carrying out processings for simultaneously depositing the first layers 21r-1, 21g-1 and 21b-1, simultaneously depositing the second layers 22r-1, 22g-1 and 22b-1 and simultaneously depositing the first layers 21r-2, 21g-2 and 21b-2 in sequence. Each of the first layers 21r-1 to 21b-2 is formed of a titanium oxide (TiO$_2$) by the sputtering process or the like, for example. The respective first layers 21r-1 to 21b-2 are formed in an equivalent film thickness. For instance, each of the first layers 21r-1 to 21b-2 is formed in such a film thickness that an optical film thickness thereof is ¼ of a central wavelength (for example, 550 nm). In other words, when a refractive index of a material (for example, TiO$_2$) is represented by n1 and a central wavelength is represented by λ, the first layers 21r-1 to 21b-2 are formed in a film thickness d1 which satisfies the following equation:

$$n1 \times d1 = (1/4) \times \lambda \qquad \text{Equation 1}$$

For example, when n1=2.5 and λ=550 nm are substituted for the Equation 1, d1=55 nm is obtained. Moreover, the second layers 22r-1, 22g-1 and 22b-1 are formed of a silicon oxide (SiO$_2$) by the CVD process or the like, for example. Each of the second layers 22r-1, 22g-1 and 22b-1 is formed in such a film thickness that an optical film thickness thereof is ¼ of a central wavelength (for example, 550 nm). In other words, when a refractive index of a material (for example, SiO$_2$) is represented by n2 and a central wavelength is represented by λ, the second layers 22r-1, 22g-1 and 22b-1 are formed in a film thickness d2 which satisfies the following equation:

$$n2 \times d2 = (1/4) \times \lambda \qquad \text{Equation 2}$$

For example, when n2=1.46 and λ=550 nm are substituted for the Equation 2, d2=94 nm is obtained.

Consequently, the lower laminated structure 25r having the first layer 21r-1, the second layer 22r-1 and the first layer 21r-2 laminated in sequence is formed in the central area CA and the peripheral area PA, respectively. The lower laminated structure 25g having the first layer 21g-1, the second layer 22g-1 and the first layer 21g-2 laminated in sequence is formed in the central area CA and the peripheral area PA, respectively. The lower laminated structure 25b having the first layer 21b-1, the second layer 22b-1 and the first layer 21b-2 laminated in sequence is formed in the central area CA and the peripheral area PA, respectively.

A viscous solution containing a coating type silicon oxide is coated onto the lower laminated structures 25r, 25g and 25b in each of the central area CA and the peripheral area PA. The viscous solution containing the coating type silicon oxide is a coating material which is suitable for a processing of a three-dimensional nanoimprint technology. For example, the viscous solution containing the coating type silicon oxide is a solution having a high viscosity in which a silicon oxide and a thermosetting component (such as a thermosetting resin) is dissolved in a solvent (such as an organic solvent), and SOG (Spin On Glass or the like). For instance, alternatively, the viscous solution containing the coating type silicon oxide is a solution having a high viscosity in which a silicon oxide and a photo-curing component (for example, an ultraviolet curing resin) is dissolved in a solvent (for example, an organic solvent).

For example, a viscous solution is coated (spin-coated) from a nozzle (not shown) toward the semiconductor substrate 10 in a state in which the semiconductor substrate 10 is rotated by a spin coating method. Consequently, the viscous solution is deposited on the lower laminated structures to form a film 26i of the viscous solution. The film 26i of the viscous solution may be formed by coating the viscous solution onto the semiconductor substrate 10 through a method other than the spin coating method, for example, a slit nozzle method.

At the step shown in FIG. 4B, there is prepared a template T to be used for the processing of the three-dimensional nanoimprint. A concavo-convex pattern corresponding to a film thickness of a control layer to be formed is provided on the template T.

For example, in the template T, corresponding parts to the pixels P-(m+1), P-m and P-(m+2) of the central area CA have thicknesses TD1r, TD1g and TD1b corresponding to the control layers 26r, 26g and 26b, respectively. For example, the thicknesses TD1r, TD1g and TD1b are equivalent to values obtained by subtracting the thicknesses D1r, D1g and D1b of the control layers 26r, 26g and 26b from a reference thickness SD, respectively.

For instance, in the template T, corresponding parts to the pixels P-(k+1), P-k and P-(k+2) of the peripheral area PA have thicknesses TD2r, TD2g and TD2b corresponding to the control layers 26r, 26g and 26b, respectively. For example, the thicknesses TD2r, TD2g and TD2b are equivalent to values obtained by subtracting the thicknesses D2r, D2g and D2b of the control layers 26r, 26g and 26b from the reference thickness SD, respectively.

By using the template T for the three-dimensional nanoimprint, the film 26i (see FIG. 4A) of the viscous solution coated onto the lower laminated structures is subjected to patterning three-dimensionally. For example, the template T is caused to come in contact with the film 26i of the viscous solution. For example, alternatively, the template T is pushed against the film 26i of the viscous solution. Consequently, the film 26i of the viscous solution enters the concave portion of the pattern which is formed on the template T by a capillary phenomenon. After the film 26i of the viscous solution sufficiently enters the concave portion, the film 26i of the viscous solution which has sufficiently entered the concave portion is cured.

For example, in the case in which the viscous solution contains a thermosetting component, the film 26i of the viscous solution which has sufficiently entered the concave portion is heated in the state shown in FIG. 4B so that the film 26i of the viscous solution is cured. At this time, it is also possible to volatilize an organic solvent contained in the film 26i of the viscous solution.

Alternatively, in the case in which the viscous solution contains a photo-curing component (for example, an ultraviolet curing resin), for example, a light (such as an ultraviolet ray) is irradiated on the film 26i of the viscous solution which has sufficiently entered the concave portion in the state shown in FIG. 4B so that the film 26i of the viscous solution is cured. Then, a predetermined heat treatment is carried out so that the organic solvent contained in the film 26i of the viscous solution can be volatilized.

After the film 26i of the viscous solution is cured, the template T is subjected to mold releasing. As shown in FIG. 4B, consequently, the pattern formed on the template T is transferred to the film 26i of the viscous solution.

In other words, the control layer 26r having the film thickness D1r is formed in the central area CA and the control layer 26r having the film thickness D2r (>D1r) is formed in the peripheral area PA. The control layer 26g having the film thickness D1g is formed in the central area CA and the control layer 26g having the film thickness D2g (>D1g) is formed in the peripheral area PA. The control layer 26b having the film thickness D1b is formed in the central area CA and the control layer 26b having the film thickness D2b (>D1b) is formed in the peripheral area PA.

At the step shown in FIG. 4C, the upper laminated structures 24r, 24g and 24b to be upper parts of the multilayer interference filters 20r, 20g and 20b are formed for the pixels P-(m+1), P-m and P-(m+2) of the central area CA and the pixels P-(k+1), P-k and P-(k+2) of the peripheral area PA, respectively. More specifically, they are formed by carrying out processings for simultaneously depositing the first layers 21r-3, 21g-3 and 21b-3, simultaneously depositing the second layers 22r-3, 22g-3 and 22b-3 and simultaneously depositing the first layers 21r-4, 21g-4 and 21b-4 in sequence. Each of the first layers 21r-3 to 21b-4 is formed of a titanium oxide ($TiO_2$) by the sputtering process or the like, for example. The first layers 21r-3 to 21b-4 are formed in equivalent film thicknesses to those of the first layers 21r-1 to 21b-2 (see FIG. 4A). For instance, each of the first layers 21r-3 to 21b-4 is formed in such a film thickness that an optical film thickness thereof is ¼ of a central wavelength (for example, 550 nm). In other words, the first layers 21r-3 to 21b-4 are formed in the film thickness d1 which satisfies the Equation 1 (for example, d1=55 nm). Moreover, each of the second layers 22r-3 to 22b-3 is formed of a silicon oxide ($SiO_2$) by the DVD process or the like, for example. The second layers 22r-3 to 22b-3 are formed in equivalent film thicknesses to those of the second layers 22r-1 to 22b-1 (see FIG. 4A). For instance, each of the second layers 22r-3 to 22b-3 is formed in such a film thickness that an optical film thickness thereof is ¼ of the central wavelength (for example, 550 nm). In other words, the second layers 22r-3 to 22b-3 are formed in the film thickness d2 which satisfies the Equation 2 (for example, d2=94 nm).

Consequently, the upper laminated structure 24r having the first layer 21r-3, the second layer 22r-3 and the first layer 21r-4 laminated in sequence is formed on the control layer 26r. In other words, the multilayer interference filter 20r having the upper laminated structure 24r, the control layer 26r and the lower laminated structure 25r is formed in the central area CA and the peripheral area PA, respectively. The upper laminated structure 24g having the first layer 21g-3, the second layer 22g-3 and the first layer 21g-4 laminated in sequence is formed on the control layer 26g. In other words, the multilayer interference filter 20g having the upper laminated structure 24g, the control layer 26g and the lower laminated structure 25g is formed in the central area CA and the peripheral area PA, respectively. The lower laminated structure 24b having the first layer 21b-3, the second layer 22b-3 and the first layer 21b-4 laminated in sequence is formed on the control layer 26b. In other words, the multilayer interference filter 20b having the upper laminated structure 24b, the control layer 26b and the lower laminated structure 25b is formed in the central area CA and the peripheral area PA, respectively.

As described above, according to the first embodiment, the control structure in the pixel of the central area CA and the control structure in the pixel of the peripheral area PA have different configurations from each other in such a manner that the filter characteristic of the multilayer interference filter in the pixel of the central area CA is equivalent to that of the multilayer interference filter in the pixel of the peripheral area PA in the solid-state image pickup device 1. Consequently, it is possible to reduce a variation in the filter characteristic of the multilayer interference filter between the pixels P-1 to P-n in the pixel array PA. Therefore, it is possible to improve the filter characteristic as a whole of the pixel array PA. As a result, it is possible to suppress a deterioration in the picture quality of an image obtained by an image signal which is picked up by the solid-state image pickup device 1, for example.

In the first embodiment, moreover, the control layer possessed by the control structure in the pixel of the peripheral area PA between the upper laminated structure and the lower laminated structure is thicker than the control layer possessed by the control structure in the pixel of the central area CA between the upper laminated structure and the lower laminated structure. Consequently, the peak of the spectral transmittance in the multilayer interference filter in the pixel of the peripheral area PA can be shifted to a long wavelength side in order to approximate to the peak of the spectral transmittance of the multilayer interference filter in the pixel of the central area CA. The filter characteristic of the multilayer interference filter in the pixel of the peripheral area PA can be caused to be equivalent to that of the multilayer interference filter in the pixel of the central area CA. In other words, it is possible to improve a deterioration in the characteristic due to an oblique incidence angle dependence as the whole of the pixel array PA.

In the first embodiment, moreover, a main surface on the semiconductor substrate 10 side of the control layer in the pixel of the peripheral area PA has a height from the semiconductor substrate 10 which is equivalent to that of a main surface on the semiconductor substrate 10 side of the control layer in the pixel of the central area CA. A main surface on an opposite side to the semiconductor substrate 10 of the control layer in the pixel of the peripheral area PA is higher from the semiconductor substrate 10 than a main surface on an opposite side to the semiconductor substrate 10 of the control layer in the pixel of the central area CA. As described above, this structure can be manufactured in a lump through the peripheral area PA and the central area CA by using the template T for the three-dimensional nanoimprint. In other words, according to the structure of the solid-state image pickup device 1 in accordance with the first embodiment, it is possible to provide the solid-state image pickup device 1 which is suitable for manufacturing, in a lump, the control structures having the different configurations between the peripheral area PA and the central area CA.

In the first embodiment, moreover, both the control layer in the pixel of the central area CA and the control layer in the pixel of the peripheral area PA are formed of a material containing a coating type silicon oxide as a principal component. This material is suitable for manufacturing the control layer in a lump through the peripheral area PA and the central area CA by using the template T for the three-dimensional nanoimprint as described above. In other words, from this viewpoint, it is possible to provide the solid-state image pickup device 1 which is suitable for manufacturing, in a lump, the control structures having the different configurations between the peripheral area PA and the central area CA.

In the first embodiment, at the step shown in FIG. 4B, the template T for the three-dimensional nanoimprint in which a concavo-convex pattern corresponding to a film thickness of a control layer to be formed is provided is used to three-dimensionally pattern the film 26$i$ of the viscous solution coated onto the lower laminated structures. More specifically, the film 26$i$ of the viscous solution is subjected to the patterning three-dimensionally in such a manner that the control layer in the pixel of the peripheral area PA is thicker than the control layer in the pixel of the central area CA. Consequently, it is possible to manufacture, in a lump, the control structures having the different configurations between the peripheral area PA and the central area CA.

Although the film thickness is increased in two stages for the control layer in the pixel of the central area CA and the control layer in the pixel of the peripheral area PA in the first embodiment, the film thickness may be increased in a multistage. For example, as shown in FIG. 1, the inner part of the pixel array PA is divided into an area in the vicinity of the center PAC of the pixel array PA, a peripheral area thereof and a further peripheral area thereof. For example, the inner part of the pixel array PA is divided into the central area CA including the center PAC of the pixel array PA which is illustrated as an area on an inner side of a broken line in FIG. 1, the peripheral area PA1 illustrated as an area between the broken line and a one-dotted chain line in FIG. 1 and the peripheral area PA2 illustrated as an area between the one-dotted chain line and a two-dotted chain line in FIG. 1. In other words, the peripheral area PA1 is provided on the outside of the central area CA and the peripheral area PA2 is provided on the outside of the peripheral area PA1.

Figure 5:
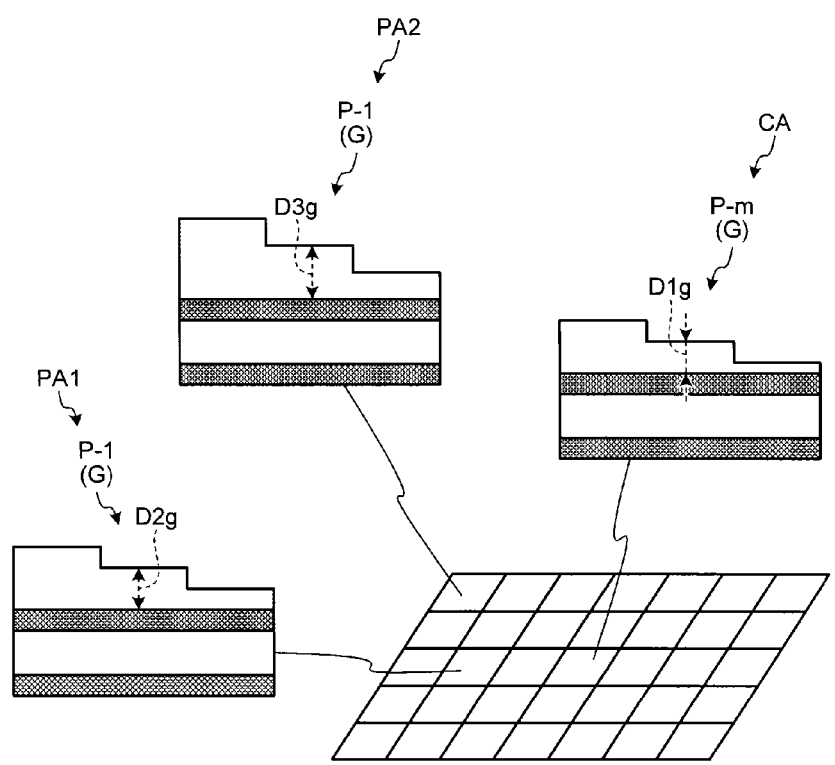
FIG. 5 is a view showing a structure of a solid-state image pickup device according to a variant of the first embodiment.

As shown in FIG. 5, the thickness of the control layer in the pixel of the peripheral area PA1 is set to be greater than the thickness of the control layer in the pixel of the central area CA between the pixels corresponding to the same color. Moreover, the thickness of the control layer in the pixel of the peripheral area PA2 is set to be greater than the thickness of the control layer in the pixel of the peripheral area PA1.

For example, all of the multilayer interference filters 20$g$ in the pixels P-m, P-k and P-1 shown in FIG. 5 are disposed to selectively guide the light having the green color (G) to the photoelectric converting unit 11$g$ (see FIG. 2). The pixel P-m is included in the central area CA, the pixel P-k is included in the peripheral area PA1 and the pixel P-1 is included in the peripheral area PA2 (see FIG. 1). In other words, the pixel P-k is disposed in a position which is more distant from the center PAC of the pixel array PA than the pixel P-m. The pixel P-1 is disposed in a position which is more distant from the center PAC of the pixel array PA than the pixel P-k. The control structure 23$g$ in the pixel P-m of the central area CA includes the control layer 26$g$ having the film thickness D1$g$ between the upper laminated structure 24$g$ and the lower laminated structure 25$g$. The control structure 23$g$ in the pixel P-k of the peripheral area PA1 has the control layer 26$g$ having the film thickness D2$g$ (>D1$g$) between the upper laminated structure 24$g$ and the lower laminated structure 25$g$. The control structure 23$g$ in the pixel P-1 of the peripheral area PA2 includes the control layer 26$g$ having the film thickness D3$g$ (>D2$g$) between the upper laminated structure 24$g$ and the lower laminated structure 25$g$. In other words, the control layer 26$g$ in the pixel P-k of the peripheral area PA1 is thicker than the control layer 26$g$ in the pixel P-m of the central area CA.

Consequently, the peak of the spectral transmittance of the multilayer interference filter 20$g$ in the pixel P-k of the peripheral area PA1 can be shifted to the long wavelength side in order to approximate to the peak of the spectral transmittance of the multilayer interference filter 20$g$ in the pixel P-m of the central area CA. The peak of the spectral transmittance of the multilayer interference filter 20$g$ in the pixel P-1 of the peripheral area PA2 can be shifted to the long wavelength side in order to approximate to the peak of the spectral transmittance of the multilayer interference filter 20$g$ in the pixel P-k of the peripheral area PA1. In other words, the filter characteristic of the multilayer interference filter 20$g$ in the pixel P-1 of the peripheral area PA2, the filter characteristic of the multilayer interference filter 20$g$ in the pixel P-k of the peripheral area PA1 and the filter characteristic of the multilayer interference filter 20$g$ in the pixel P-m of the central area CA can be equivalent to each other.

Accordingly, it is possible to reduce, in a multistage, a variation in the filter characteristic in the pixel array PA. Therefore, it is possible to further improve the filter characteristic as the whole of the pixel array PA.

Although the film thickness is increased in two stages for the control layer in the pixel of the central area CA and the control layer in the pixel of the peripheral area PA in the first embodiment, alternatively, it is also possible to continuously increase the film thickness depending on a distance of a pixel center thereof from the center PAC of the pixel array PA.

For example, there is experimentally acquired a function f1 shown in the following Equation 3 for obtaining a shift quantity S of the peak of the spectral transmittance to a distance L from the center PAC of the pixel array PA.

$$S=f1(L) \quad \text{Equation 3}$$

Furthermore, there is experimentally acquired a function f2 shown in the following Equation 4 for obtaining a film thickness increment ΔD to correct the shift quantity S of the peak of the spectral transmittance.

$$\Delta D=f2(S) \quad \text{Equation 4}$$

For example, referring to the pixel P-m in the vicinity of the center PAC of the pixel array PA, a distance L-m from the center of the pixel array PA to the pixel center is approximately zero. Therefore, the film thickness increment ΔD is approximately zero in accordance with the Equations 3 and 4.

For example, the pixel P-k which is more distant from the center PAC of the pixel array PA is made greater than the film thickness increment ΔD in accordance with the Equations 3 and 4 because a distance L-k from the center of the pixel array PA to the pixel center is greater.

Therefore, it is possible to continuously reduce the variation in the filter characteristic in the pixel array PA in accordance with the Equations 3 and 4. Consequently, it is possible to further improve the filter characteristic as the whole of the pixel array PA.

Second Embodiment

Next, a solid-state image pickup device 1$i$ according to a second embodiment will be described. Different parts from the first embodiment will be mainly described below.

Although the configuration of the control structure is varied depending on a change in the thickness of the control layer between the central area CA and the peripheral area PA in the first embodiment, the configuration of the control structure is also varied depending on the presence of the control layer between the central area CA and the peripheral area PA in the second embodiment.

Figure 6:
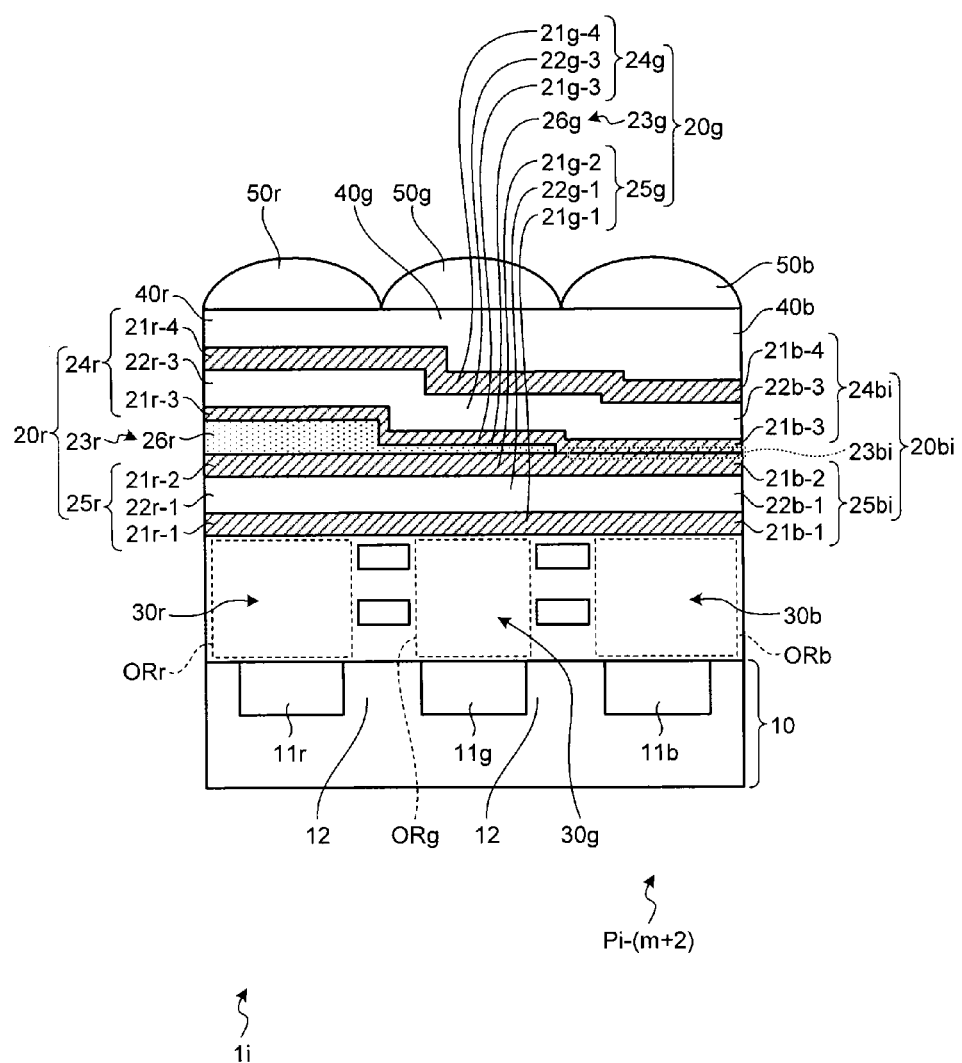
FIG. 6 is a view showing a structure of a solid-state image pickup device according to a second embodiment.

More specifically, the solid-state image pickup device 1$i$ has a control structure 23$bi$ of a pixel Pi-(m+2) corresponding to a blue color (B) of the central area CA which is different from that of the first embodiment as shown in FIG. 6. The control structure 23$bi$ has such a structure as to cause an upper laminated structure 24$bi$ and a lower laminated structure 25$bi$ to come in contact with each other. The control structure 23$bi$ can also be regarded to virtually have a control layer in a film thickness of zero between the upper laminated structure 24$bi$ and the lower laminated structure 25$bi$.

Figure 7:
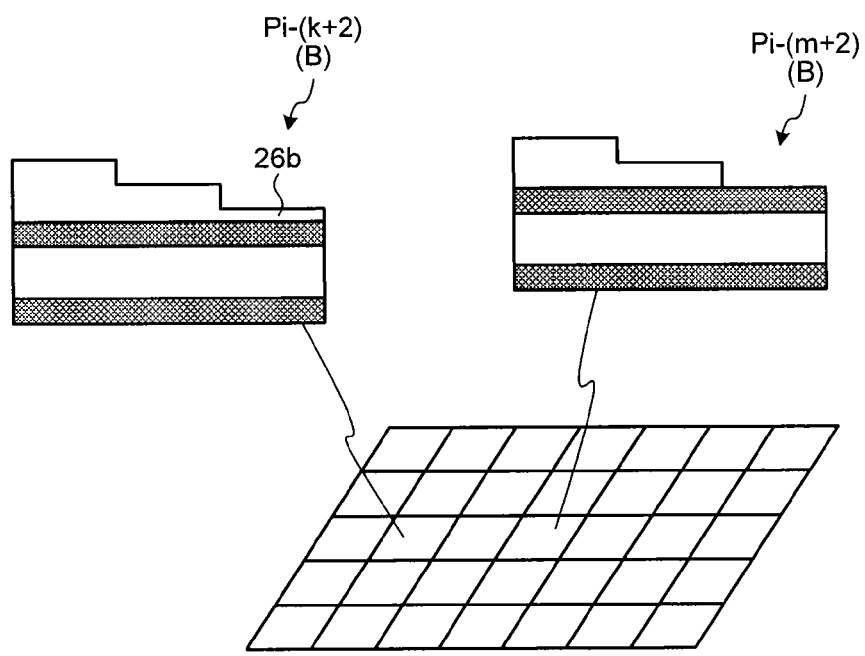
FIG. 7 is a view showing the structure of the solid-state image pickup device according to the second embodiment.

As shown in FIG. 7, a control layer 26g is provided in a pixel Pi-(k+2) of the peripheral area PA between pixels corresponding to the same color (that is, the blue color (B)), while a control layer is not provided in the pixel Pi-(m+2) of the central area CA. Consequently, a peak of a spectral transmittance of a multilayer interference filter 20b in the pixel Pi-(k+2) of the peripheral area PA can be shifted to a long wavelength side in order to approximate to a peak of a spectral transmittance of a multilayer interference filter 20g in the pixel Pi-(m+2) of the central area CA. In other words, a filter characteristic of the multilayer interference filter 20b in the pixel Pi-(k+2) of the peripheral area PA can be made equivalent to that of the multilayer interference filter 20g in the pixel Pi-(m+2) of the central area CA.

In the second embodiment, thus, the configuration of the control structure is varied depending on the presence of the control layer so that the filter characteristic of the multilayer interference filter 20b in the pixel Pi-(k+2) of the peripheral area PA can be made equivalent to that of the multilayer interference filter 20g in the pixel Pi-(m+2) of the central area CA.

As shown in FIG. 7, the upper laminated structure and the lower laminated structure may have mutually asymmetrical constructions with respect to an interface between the upper laminated structure and the lower laminated structure. In other words, in the multilayer interference filter, the upper laminated structure and the lower laminated structure have parts of their corresponding layers which are thinner than the residual layers, and film thicknesses of the corresponding layers other than the partial layers may be equivalent to each other. For example, in the upper laminated structure and the lower laminated structure, a first layer 21-3 in their corresponding first layers 21-1 to 21-4 may be thinner than the residual first layers 21-1, 21-2 and 21-4 (for example, a film thickness of 25 nm). More specifically, the lowest first layer 21-3 in the upper laminated structure is thinner than the first layer 21-4 in the upper laminated structure, and furthermore, is thinner than the first layers 21-1 and 21-2 in the lower laminated structure. In the upper laminated structure and the lower laminated structure, the first layers 21-1, 21-2 and 21-4 other than the first layer 21-3 have film thicknesses which are equivalent to each other (for example, a film thickness of 55 nm), and the second layers 22-1 and 22-3 have film thicknesses which are equivalent to each other (for example, a film thickness of 94 nm). In other words, in the multilayer interference filter, the upper laminated structure and the lower laminated structure have asymmetrical constructions obtained through an addition of a change for thinning the first layer 21-3 to a reference construction by setting, as the reference construction, mutually symmetrical constructions with respect to the interface between the upper laminated structure and the lower laminated structure.

With the construction, when thicknesses of control layers for a blue color (B), a green color (G) and a red color (R) are set to be 0 nm, 35 nm and 85 nm, a primary peak of the spectral transmittance of the multilayer interference filter appears in wavelength bands of the blue color (B), the green color (G) and the red color (R), respectively. In other words, in the case in which the control layer is not provided (the thickness is virtually set to be 0 nm), the primary peak of the spectral transmittance of the multilayer interference filter appears in a wavelength band for the blue color (B). In the case in which a shorter wavelength side from a central wavelength is caused to have the peak of the spectral transmittance, thus, the primary peak can be used as the peak of the spectral transmittance. Therefore, it is possible to increase a spectral width of a transmittance. In the solid-state image pickup device 1i, consequently, a photoelectric converting unit corresponding to a multilayer interference filter for a color (for example, a blue color) on a shorter wavelength side from the central wavelength can receive a light in a sufficient quantity for a demanded sensitivity, thereby enhancing the sensitivity. In other words, it is possible to enhance the sensitivity of the photoelectric converting unit corresponding to the multilayer interference filter for the color (for example, the blue color) on the shorter wavelength side from the central wavelength.

Third Embodiment

Next, a solid-state image pickup device 1k according to a third embodiment will be described. Different parts from the first embodiment will be mainly described below.

Although there is illustrated the case in which the whole inner part of the pixel array PA is a color array in accordance with a Bayer array in the first embodiment, for example, there is a tendency that a picture quality of the peripheral area PA is deteriorated more greatly than the central area CA in the pixel array PA.

In the second embodiment, therefore, a color array is changed between the central area CA and the peripheral area PA in the pixel array PA in consideration of a difference in the tendency of the picture quality deterioration in the central area CA and the peripheral area PA.

Figure 8A:
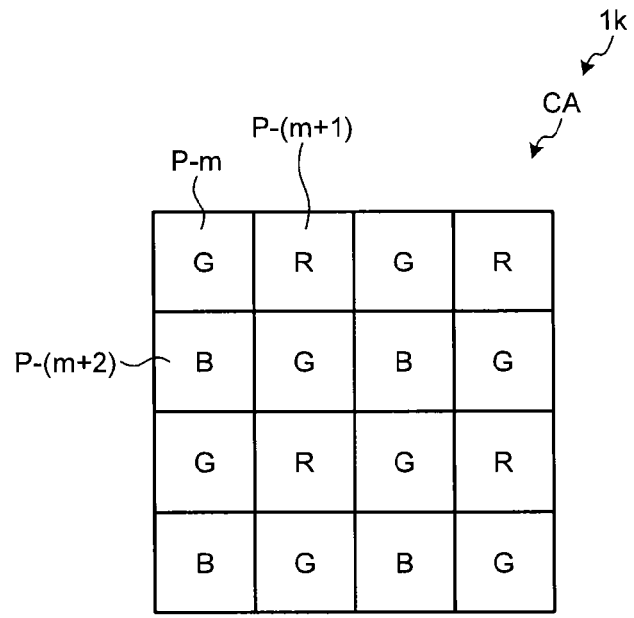
FIGS. 8A and 8B are views showing a structure of a solid-state image pickup device according to a third embodiment.

More specifically, in the solid-state image pickup device 1k, a color arrangement in accordance with the Bayer array is carried out in the central area CA as shown in FIG. 8A. The Bayer array is constituted by setting, as a unit, four pixels for green (G), red (R), blue (B) and green (G).

Figure 8B:
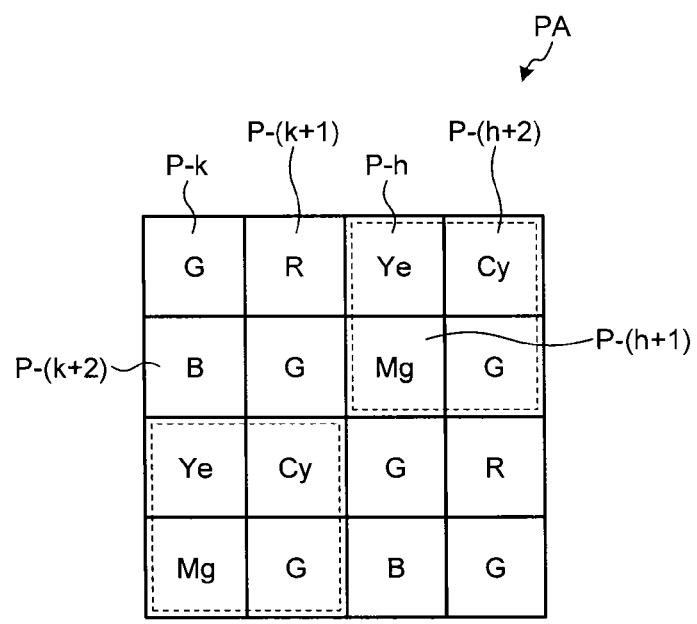

On the other hand, in the peripheral area PA, a part of the Bayer array is replaced with a complementary color filter array as shown in a broken line of FIG. 8B in order to suppress a deterioration in a picture quality. The complementary color filter array is constituted by setting, as a unit, four pixels for yellow (Ye), cyan (Cy), magenta (Mg) and the green (G).

In this case, for example, it is possible to complementarily enhance the picture quality by arranging the four-pixel unit of the Bayer array and the four-pixel unit for the complementary color filter array like a hound's tooth in which they are shifted in a two-pixel pitch vertically and transversely each other as shown in FIG. 8B.

Figure 9:
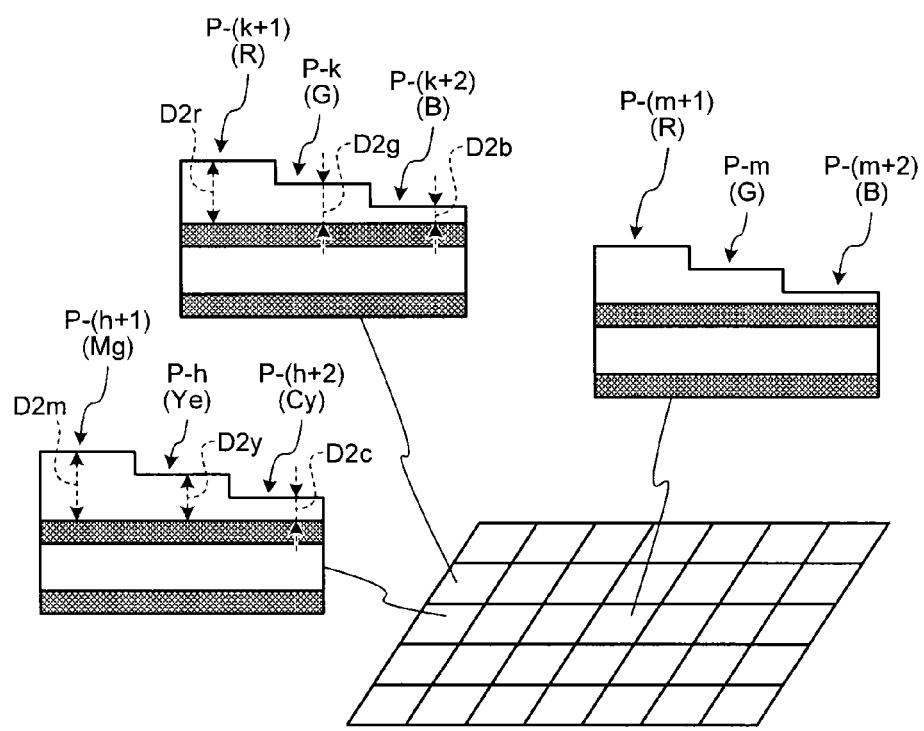
FIG. 9 is a view showing the structure of the solid-stage image pickup device according to the third embodiment.

As shown in FIG. 9, a multilayer interference filter in a pixel P-(h+2) corresponding to the cyan (Cy) is disposed to selectively guide, to a photoelectric converting unit, a light having a longer wavelength than a multilayer interference filter in a pixel P-(k+2) corresponding to the blue (B) and having a shorter wavelength than a multilayer interference filter in a pixel (P-k) corresponding to the green (G). Correspondingly, a film thickness D2c of a control layer in the pixel P-(h+2) is greater than a film thickness D2b of a control layer in the pixel P-(k+2) and is smaller than a film thickness D2g of a control layer in the pixel P-k.

A multilayer interference filter in a pixel P-h corresponding to the yellow (Ye) is disposed to selectively guide, to the photoelectric converting unit, a light having a longer wavelength than the multilayer interference filter in the pixel P-k corresponding to the green (G) and having a shorter wavelength than a multilayer interference filter in a pixel P-(k+1) corresponding to the red (R). Correspondingly, a film thickness D2y of a control layer in a pixel P-h is greater than the film thickness D2g of the control layer in the pixel P-k and is smaller than a film thickness D2r of a control layer in the pixel P-(k+1).

A multilayer interference filter in a pixel P-(h+1) corresponding to the magenta (Mg) is disposed to selectively guide, to the photoelectric converting unit, a light having a longer wavelength than the multilayer interference filter in the pixel P-(k+1) corresponding to the red (R). Correspondingly, a film thickness D2$m$ of a control layer in the pixel P-(h+1) is greater than the film thickness D2$r$ of the control layer in the pixel P-(k+1).

In the third embodiment, thus, the color array of the central area CA in the pixel array PA is constituted by the Bayer array and the color array of the peripheral area PA is constituted by mixing the Bayer array and the complementary color filter array. Consequently, the image quality can be made equivalent in the central area CA and the peripheral area PA.

Although it is necessary to prepare control layers having six different film thicknesses in the peripheral area PA as described above in the third embodiment, the template T is formed to possess portions having corresponding thicknesses to the six different film thicknesses in a corresponding area to the peripheral area PA so that a manufacture can be carried out in the same manner as in the first embodiment.

Fourth Embodiment

Next, a solid-state image pickup device 1$j$ according to a fourth embodiment will be described. Different parts from the first embodiment will be mainly described below.

In the first embodiment, the control layer in the pixel of the peripheral area PA is caused to be thicker than the control layer in the pixel of the central area CA. For this reason, there is a fear that a color mixture between adjacent pixels might be caused in the peripheral area PA, for example. In the fourth embodiment, therefore, there is further added a structure for reducing the color mixture between the adjacent pixels.

Figure 10:
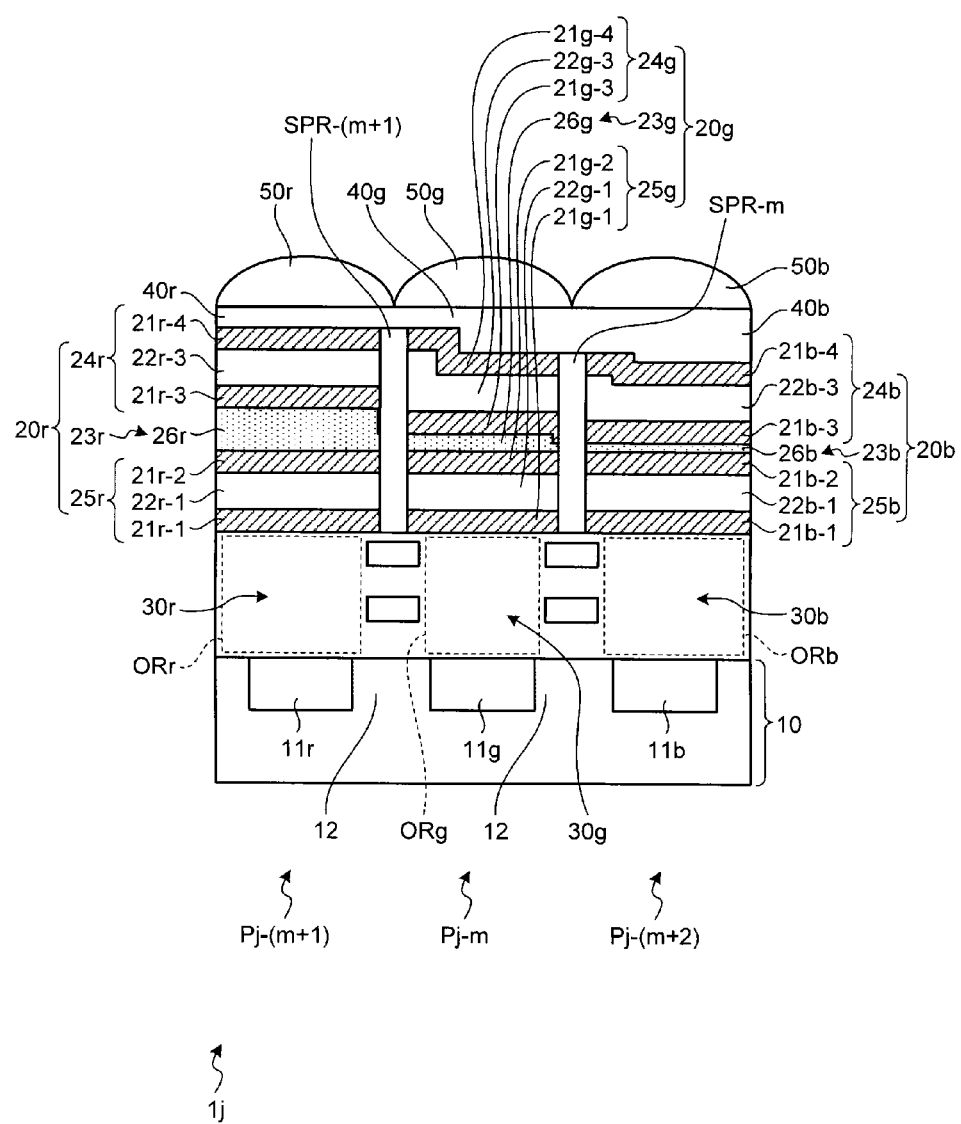
FIG. 10 is a view showing a structure of a solid-state image pickup device according to a fourth embodiment.

More specifically, the solid-state image pickup device 1$j$ has a separate area for dividing, like a grid, multilayer interference filters of pixels in the pixel array PA, for example. For instance, a separate area SPR-(m+1) shown in FIG. 10 separates a multilayer interference filter 20$r$ of a pixel Pj-(m+1) and a multilayer interference filter 20$g$ of a pixel Pj-m from each other in a transverse direction (that is, a direction along a surface of a semiconductor substrate 10). For example, a separate area SPR-m shown in FIG. 10 separates the multilayer interference filter 20$g$ of the pixel Pj-m and a multilayer interference filter 20$b$ of a pixel Pj-(m+2) from each other in the transverse direction (that is, the direction along the surface of the semiconductor substrate 10). The separate areas SPR-(m+1) and SPR-m may be filled with air or a predetermined gas (for example, a nitrogen gas), for example.

Figure 11A:
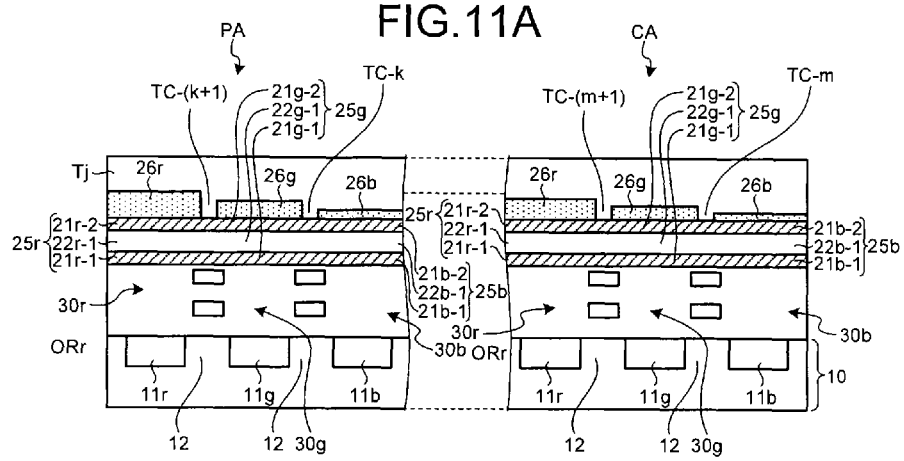
FIGS. 11A to 11C are views each showing a method of manufacturing the solid-state image pickup device according to the fourth embodiment.
Figure 11B:
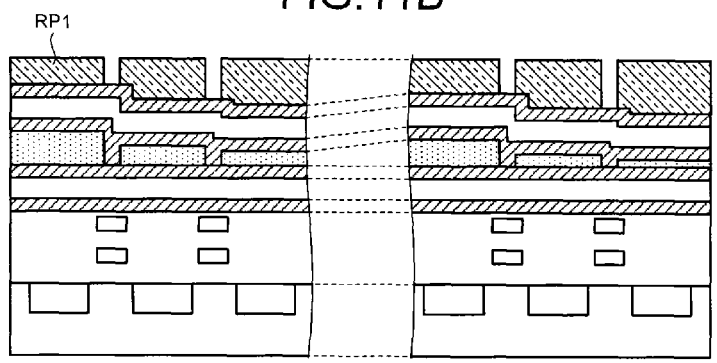
Figure 11C:
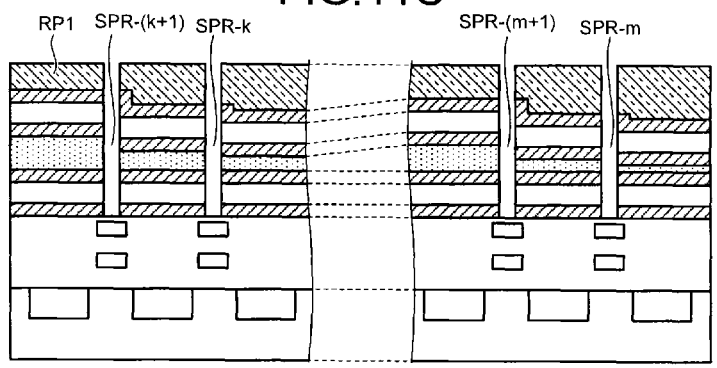

Moreover, a method of manufacturing the solid-state image pickup device 1$j$ is different from that of the first embodiment as shown in FIGS. 11A to 11C.

A step shown in FIG. 11A is carried out after the step shown in FIG. 4A. At the step shown in FIG. 11A, a template Tj for a three-dimensional nanoimprint is used. The template Tj has a structure obtained by an addition of a convex pattern TC-(k+1), TC-k, TC-(m+1), TC-m or the like which takes a shape of a grid as seen on a plane (that is, a corresponding shape to a line for dividing the pixels shown in FIG. 1), for example, by setting, as a basis, the structure of the template T to be used in the step shown in FIG. 1B. By using the template Tj, the film 26$i$ of the viscous solution coated onto the lower laminated structures (see FIG. 4A) is subjected to patterning three-dimensionally in the same manner as in the step shown in FIG. 4B. As shown in FIG. 11A, consequently, island-shaped control layers 26$r$ to 26$b$ are formed in the central area CA and the peripheral area PA, respectively.

At a step shown in FIG. 11B, the upper laminated structure is formed in the same manner as in the step shown in FIG. 4C and an island-shaped resist pattern RP1 corresponding to the island-shaped control layers 26$r$ to 26$b$ is then formed on each of the upper laminated structures.

At a step shown in FIG. 11C, the resist pattern RP1 is used as a mask to carry out dry etching on a high anisotropic condition, for example. Consequently, there is formed a separate area SPR-(k+1), SPR-k, SPR-(m+1), SPR-m or the like for dividing, like a grid, multilayer interference filters of pixels in the pixel array PA, for example. Thereafter, the resist pattern RP1 is removed.

In the fourth embodiment, thus, the separate area for dividing, like the grid, the multilayer interference filters of the pixels in the pixel array PA, for example, separates the multilayer interference filters of the adjacent pixels from each other in the transverse direction (that is, the direction along the surface of the semiconductor substrate 10). Consequently, it is possible to reduce the color mixture of the adjacent pixels.

The separate area for dividing, like the grid, the multilayer interference filters of the pixels, for example, is not provided in the central area CA but may be selectively provided in the peripheral area PA. In this case, it is possible to reduce the color mixture of the adjacent pixels in the peripheral area PA, thereby causing color mixing characteristics of the central area CA and the peripheral area PA to be equivalent to each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state image pickup device comprising a pixel array having a plurality of pixels arranged two-dimensionally,
    each of the plurality of pixels including:
    a photoelectric converting unit; and
    a multilayer interference filter disposed to selectively guide, to the photoelectric converting unit, any of incident lights which has a specific color,
    the multilayer interference filter in each of the plurality of pixels including:
    an upper laminated structure in which first and second layers having different refractive indices from each other are laminated alternately;
    a lower laminated structure in which the first layer and the second layer are laminated alternatively; and
    a control structure formed between the upper laminated structure and the lower laminated structure in order to control a filter characteristic of the multilayer interference filter,
    wherein both the multilayer interference filter in a first pixel of the plurality of pixels and the multilayer interference filter in a second pixel of the plurality of pixels which is more distant from a center of the pixel array than the first pixel are disposed to selectively guide a light having a first color to the photoelectric converting unit, and
    wherein the control structure in the first pixel has a first control layer between the upper laminated structure and the lower laminated structure, and the control structure in the second pixel has a second control layer which is thicker than the first control layer, between the upper laminated structure and the lower laminated structure.

2. The solid-state image pickup device according to claim 1, further comprising a semiconductor substrate,
a main surface on the semiconductor substrate side of the first control layer and a main surface on the semiconductor substrate side of the second control layer have equivalent heights from the semiconductor substrate to each other, and
a main surface on an opposite side to the semiconductor substrate of the second control layer is higher from the semiconductor substrate than a main surface on an opposite side to the semiconductor substrate of the first control layer.

3. The solid-state image pickup device according to claim 1, wherein the first control layer and the second control layer are formed of a material containing a coating type silicon oxide as a principal component.

4. The solid-state image pickup device according to claim 1, wherein the multilayer interference filter in a third pixel which is more distant from the center of the pixel array than the second pixel of the pixels, is disposed to selectively guide the light having the first color to the photoelectric converting unit, and
the control structure in the third pixel has a third control layer which is thicker than the second control layer, between the upper laminated structure and the lower laminated structure.

5. The solid-state image pickup device according to claim 4, further comprising a semiconductor substrate,
wherein a main surface on the semiconductor substrate side of the second control layer and a main surface on the semiconductor substrate side of the third control layer have equivalent heights from the semiconductor substrate to each other, and
a main surface on an opposite side to the semiconductor substrate of the third control layer is higher from the semiconductor substrate than a main surface on an opposite side to the semiconductor substrate of the second control layer.

6. The solid-state image pickup device according to claim 4, wherein the first control layer, the second control layer and the third control layer are formed of a material containing a coating type silicon oxide as a principal component.

7. The solid-state image pickup device according to claim 1, wherein both the multilayer interference filter in a fourth pixel which is adjacent to the first pixel of the pixels and the multilayer interference filter in a fifth pixel which is adjacent to the second pixel of the pixels, are disposed to selectively guide a light having a second color in a longer wavelength than the light having the first color to the photoelectric converting unit,
the control structure in the fourth pixel has a fourth control layer which is thicker than the first control layer between the upper laminated structure and the lower laminated structure, and
the control structure in the fifth pixel has a fifth control layer which is thicker than the second control layer and which is thicker than the fourth control layer, between the upper laminated structure and the lower laminated structure.

8. The solid-state image pickup device according to claim 7, further comprising a semiconductor substrate,
wherein a main surface on the semiconductor substrate side of the fourth control layer and a main surface on the semiconductor substrate side of the fifth control layer have equivalent heights from the semiconductor substrate to each other, and
a main surface on an opposite side to the semiconductor substrate of the fifth control layer is higher from the semiconductor substrate than a main surface on an opposite side to the semiconductor substrate of the fourth control layer.

9. The solid-state image pickup device according to claim 7, wherein the fourth control layer and the fifth control layer are formed of a material containing a coating type silicon oxide as a principal component.

10. The solid-state image pickup device according to claim 7, wherein the multilayer interference filter in a sixth pixel which is more distant from the center of the pixel array than the fifth pixel of the pixels, is disposed to selectively guide the light having the second color to the photoelectric converting unit, and
the control structure in the sixth pixel has a sixth control layer which is thicker than the fifth control layer, between the upper laminated structure and the lower laminated structure.

11. The solid-state image pickup device according to claim 10, further comprising a semiconductor substrate,
wherein a main surface on the semiconductor substrate side of the fifth control layer and a main surface on the semiconductor substrate side of the sixth control layer have equivalent heights from the semiconductor substrate to each other, and
a main surface on an opposite side to the semiconductor substrate of the sixth control layer is higher from the semiconductor substrate than a main surface on an opposite side to the semiconductor substrate of the fifth control layer.

12. The solid-state image pickup device according to claim 10, wherein the fourth control layer, the fifth control layer and the sixth control layer are formed of a material containing a coating type silicon oxide as a principal component.

13. The solid-state image pickup device according to claim 10, wherein both the multilayer interference filter in a seventh pixel which is adjacent to the first pixel of the pixels and the multilayer interference filter in an eighth pixel which is adjacent to the second pixel of the pixels, are disposed to selectively guide a light having a third color in a shorter wavelength than the light having the first color to the photoelectric converting unit,
the control structure in the seventh pixel causes the upper laminated structure and the lower laminated structure to come in contact with each other, and
the control structure in the eighth pixel has an eighth control layer between the upper laminated structure and the lower laminated structure.

14. The solid-state image pickup device according to claim 13, further comprising a semiconductor substrate,
wherein a main surface on the semiconductor substrate side of the upper laminated structure of the seventh pixel and a main surface on the semiconductor substrate side of the eighth control layer of the eighth pixel have equivalent heights from the semiconductor substrate to each other, and
a main surface on an opposite side to the semiconductor substrate of the eighth control layer is higher from the semiconductor substrate than a main surface on an opposite side to the semiconductor substrate of the lower laminated structure of the seventh pixel.

15. The solid-state image pickup device according to claim 13, wherein the eighth control layer are formed of a material containing a coating type silicon oxide as a principal component.

16. The solid-state image pickup device according to claim 13, wherein the multilayer interference filter in a ninth pixel which is more distant from the center of the pixel array than the eighth pixel of the pixels, is disposed to selectively guide the light having the third color to the photoelectric converting unit, and the control structure in the ninth pixel has a ninth control layer which is thicker than the eighth control layer, between the upper laminated structure and the lower laminated structure.

17. The solid-state image pickup device according to claim 16, further comprising a semiconductor substrate, wherein a main surface on the semiconductor substrate side of the eighth control layer and a main surface on the semiconductor substrate side of the ninth control layer have equivalent heights from the semiconductor substrate to each other, and a main surface on an opposite side to the semiconductor substrate of the ninth control layer is higher from the semiconductor substrate than a main surface on an opposite side to the semiconductor substrate of the eighth control layer.

18. The solid-state image pickup device according to claim 16, wherein the eighth control layer and the ninth control layer are formed of a material containing a coating type silicon oxide as a principal component.

19. A method of manufacturing a solid-state image pickup device having a pixel array in which a plurality of pixels is arranged two-dimensionally, a formation of the pixels comprising: forming a plurality of photoelectric converting units; and forming a plurality of multilayer interference filters above the plurality of photoelectric converting units, each of which has a lower laminated structure, a control layer and an upper laminated structure to selectively guide, to the photoelectric converting units, any of incident lights which has a specific color, the formation of the plurality of multilayer interference filters including: alternately laminating first and second layers having different refractive indices from each other to form the plurality of lower laminated structures above the plurality of photoelectric converting units; coating a viscous solution containing a coating type silicon oxide on the plurality of lower laminated structures; three-dimensionally patterning a film of the coated viscous solution to form the plurality of control layers by using a template for a three-dimensional nanoimprint; and alternatively laminating the first layer and the second layer to form the plurality of upper laminated structures on the viscous solution subjected to the patterning, wherein in the formation of the plurality of control layers, the coated viscous solution is subjected to patterning three-dimensionally in such a manner that a second control layer in a second pixel of the plurality of pixels which is more distant from a center of the pixel array than a first pixel of the plurality of pixels is thicker than a first control layer in the first pixel so that both the multilayer interference filter in the first pixel and the multilayer interference filter in the second pixel are disposed to selectively guide a light having a first color to the photoelectric converting unit.

\* \* \* \* \*